(12) United States Patent
Manfrini et al.

(10) Patent No.: US 11,569,294 B2
(45) Date of Patent: Jan. 31, 2023

(54) SEMICONDUCTOR DEVICE AND MANUFACTURING METHOD THEREOF

(71) Applicant: Taiwan Semiconductor Manufacturing Co., Ltd., Hsinchu (TW)

(72) Inventors: Mauricio Manfrini, Hsinchu County (TW); Chung-Te Lin, Tainan (TW); Ken-Ichi Goto, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 120 days.

(21) Appl. No.: 16/924,162

(22) Filed: Jul. 8, 2020

(65) Prior Publication Data

US 2022/0013580 A1    Jan. 13, 2022

(51) Int. Cl.
| | | |
|---|---|---|
| H01L 27/22 | (2006.01) | |
| H01L 29/423 | (2006.01) | |
| H01L 23/528 | (2006.01) | |
| H01L 43/10 | (2006.01) | |
| H01L 43/08 | (2006.01) | |
| H01L 43/12 | (2006.01) | |
| H01L 43/02 | (2006.01) | |

(52) U.S. Cl.
CPC .......... *H01L 27/226* (2013.01); *H01L 23/528* (2013.01); *H01L 29/42392* (2013.01); *H01L 43/02* (2013.01); *H01L 43/08* (2013.01); *H01L 43/10* (2013.01); *H01L 43/12* (2013.01)

(58) Field of Classification Search
CPC ................. H01L 27/226; H01L 23/528; H01L 29/42392; H01L 43/02; H01L 43/08; H01L 43/10; H01L 43/12
See application file for complete search history.

(56) References Cited

U.S. PATENT DOCUMENTS

2020/0006424 A1* 1/2020 Sato .................... H01F 10/3254

* cited by examiner

*Primary Examiner* — Marc Anthony Armand
(74) *Attorney, Agent, or Firm* — JCIPRNET

(57) ABSTRACT

A semiconductor device includes a semiconductor substrate and an interconnection region disposed on the semiconductor substrate. The interconnection region includes stacked metallization levels, a magnetic tunnel junction, and a transistor. The magnetic tunnel junction is formed on a first conductive pattern of a first metallization level of the stacked metallization levels. The transistor is formed on a second conductive pattern of a second metallization level of the stacked metallization levels. The transistor is a vertical gate-all-around transistor. A drain contact of the transistor is electrically connected to the magnetic tunnel junction by the first conductive pattern of the first metallization level. The second metallization level is closer to the semiconductor substrate than the first metallization level.

20 Claims, 39 Drawing Sheets

SEMICONDUCTOR DEVICE AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Challenges from both fabrication and design issues have resulted in the development of three-dimensional designs, such as fin field-effect transistors (FinFETs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 14A are schematic cross-sectional views of structures formed during a manufacturing process of a semiconductor device in accordance with some embodiments of the disclosure.

FIG. 2B to FIG. 14B are schematic top views of the corresponding structures of FIG. 2A to FIG. 14A.

DETAILED DESCRIPTION

Figure 1:
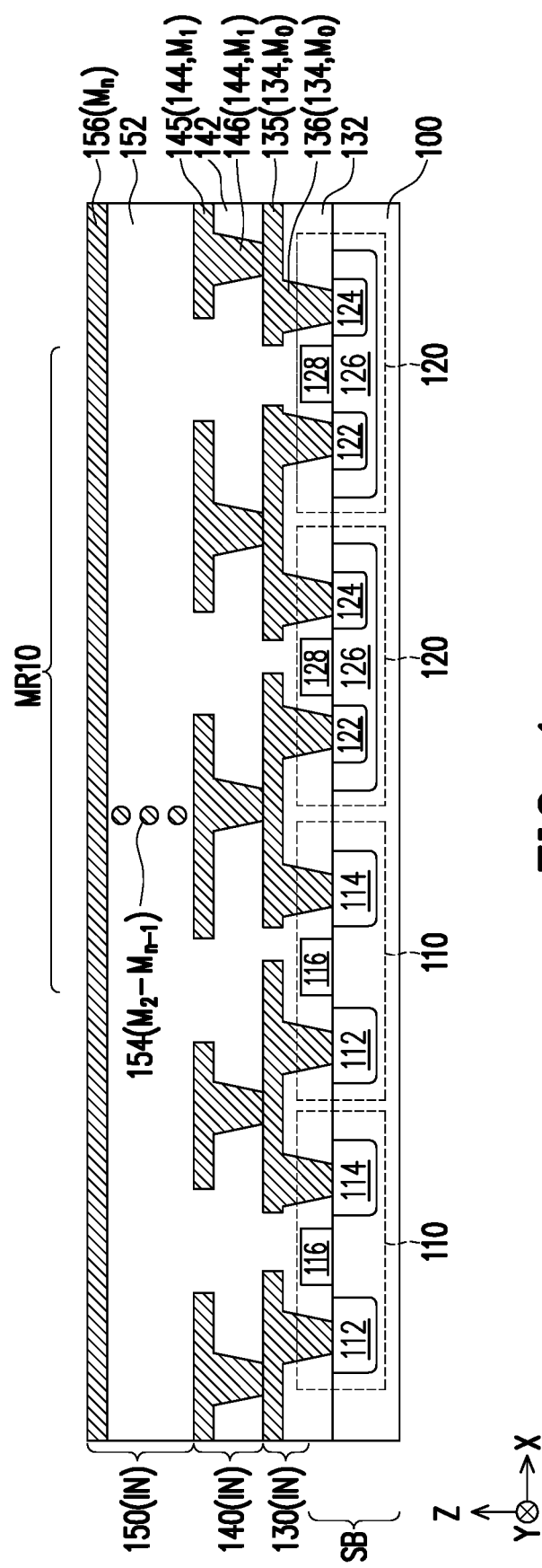
FIG. 1 is a schematic cross-sectional view of a structure formed during a manufacturing process of a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1, FIG. 2A to FIG. 14A, and FIG. 15 are schematic cross-sectional views illustrating a manufacturing process of a semiconductor device D10 in accordance with some embodiments of the disclosure. FIG. 2B to FIG. 14B are schematic top views of the corresponding structures of FIG. 2A to FIG. 14A. Referring to FIG. 1, a semiconductor substrate 100 is provided. In some embodiments, the semiconductor substrate 100 includes one or more semiconductor materials, which may be elemental semiconductor materials, compound semiconductor materials, or semiconductor alloys. For instance, the elemental semiconductor material may include Si or Ge. The compound semiconductor materials and the semiconductor alloys may respectively include SiGe, SiC, SiGeC and a III-V semiconductor or a II-VI semiconductor. In some embodiments, the semiconductor substrate 100 may be a semiconductor-on-insulator, including at least one layer of dielectric material (e.g., an oxide layer) disposed between a pair of semiconductor layers. In some embodiments, devices of an integrated circuit are formed in and on the semiconductor substrate 100. For example, in FIG. 1 are illustrated two planar transistors 110 and two planar transistors 120 formed on the semiconductor substrate 100. Each planar transistor 110 includes at least one pair of source and drain regions 112, 114 separated by a portion of semiconductor substrate 100 which functions as a channel region of the transistor 110. A gate structure 116 is disposed on the channel region in between the source and drain regions 112, 114. In some embodiments, the source and drain regions 112, 114 may be doped, for example with n-type materials or p-type materials. In some embodiments, each planar transistor 120 also includes a pair of source and drain regions 122, 124, which may be optionally doped with n-type materials or p-type materials. In some embodiments, the source and drain regions 122, 124 are doped with materials of opposite conductivity type with respect to the source and drain regions 112, 114. In some embodiments, the source and drain regions 122, 124 may be embedded in a region 126 doped with a material of opposite conductivity type. For example, the source and drain regions 122, 124 may be doped with a p-type material, and the region 126 may be doped with an n-type material. In some embodiments, a gate structure 128 is disposed on the region 126 in between the source and drain regions 122, 124. In some embodiments, the semiconductor substrate 100 with the transistors 110, 120 formed therein may be referred to as a substrate region SB, or, sometimes, front-end-of-line (FEOL) region. It should be noted that while planar transistors 110, 120 are illustrated in FIG. 1A, the disclosure is not limited thereto, and other types of transistor (e.g., GAA, FinFET, etc.) are also contemplated within the scope of the disclosure. Similarly, devices other than transistors (e.g., inductors, resistors, capacitors, diodes, and so on) may also be part of the semiconductor device D10.

In some embodiments, the lower tiers 130, 140, 150 of an interconnection region (IN) are formed on the substrate region SB. In some embodiments, each tier 130, 140, 150 of the interconnection region (IN) includes an interlayer dielectric 132, 142, 152 and conductive patterns 134, 144, 154, 156 disposed on the corresponding interlayer dielectric 132, 142, 152. For example, the bottommost tier 130 includes the interlayer dielectric 132 disposed on the semiconductor substrate 100 and the conductive patterns 134 disposed on and through the interlayer dielectric 132. The conductive patterns 134 include routing traces 135 and interconnect vias 136. The routing traces 135 may extend horizontally (e.g., in the XY plane, substantially parallel to the semiconductor substrate 100) on the interlayer dielectric 132, while the interconnect vias 136 may extend vertically (in the Z direction) through the interlayer dielectric 132 to establish electrical connection between the routing traces 135 and the devices (e.g., the transistors 110, 120) formed in the substrate region SB. Similarly, the second tier 140 of the interconnection region IN is stacked on the bottommost tier 130, and also includes an interlayer dielectric 142 and conductive patterns 144. The conductive patterns 144 include routing traces 145 and interconnect vias 146 extending through the interlayer dielectric 142 to establish electrical connection between the routing traces 135 and the routing traces 145. Additional tiers 150 may be stacked on the lowest tiers 130, 140, each tier of the additional tiers 150 including its own interlayer dielectric 152 and conductive patterns 154 (schematically represented by dots in FIG. 1). In some embodiments, the conductive patterns 134, 144, 154, 156 may be referred to as metallization levels of the interconnection region IN, and may be sequentially numbered starting from $M_0$ for the metallization level closest to the semiconductor substrate 100. For example, the conductive patterns 134 may be referred to as metallization level $M_0$ and the conductive patterns 144 may be referred to as a metallization level $M_1$. Depending on the number of additional tiers 150, the conductive patterns 154 may be referred to as metallization levels $M_2$ to $M_{n-1}$, and the conductive patterns 156 of the topmost additional tier 150 may be referred as an $n^{th}$ metallization level $M_n$. In some embodiments, n can be an integer in the range from 4 to 15.

In some embodiments, the interlayer dielectrics 132, 142, 152 may include low-k dielectric materials. Examples of low-k dielectric materials include Xerogel, Aerogel, amorphous fluorinated carbon, parylene, BCB (bis-benzocyclobutenes), flare, hydrogen silsesquioxane (HSQ), fluorinated silicon oxide (SiOF), or a combination thereof. In some embodiments, the interlayer dielectrics 132, 142, 152 may be fabricated to a suitable thickness by flowable CVD (FCVD), CVD, HDPCVD, SACVD, spin-on, sputtering, or other suitable methods. In some embodiments, the interlayer dielectric of a tier (e.g., the interlayer dielectric 132 of the tier 130) may be formed during multiple steps and be constituted by two or more layers which may include the same or different dielectric materials. In some embodiments, the conductive patterns 134, 144, 154, 156 may include aluminum, titanium, copper, nickel, tungsten, and/or alloys thereof, and may be fabricated through a sequence of deposition (e.g., CVD, plating, or other suitable processes) and planarization steps (e.g., chemical mechanical polishing). In some embodiments, the tiers 130, 140, 150 of the interconnection region IN may be formed via damascene, dual damascene, or other suitable processes. The position (in terms of level height along the Z direction with respect to the semiconductor substrate 100) of the boundaries between the interlayer dielectrics 132, 142, 152 may depend on the process followed for the formation of the interconnection region IN.

Figure 2A:
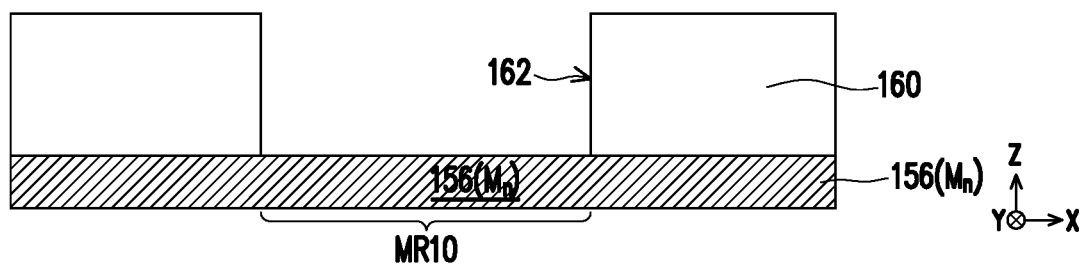
Figure 2B:
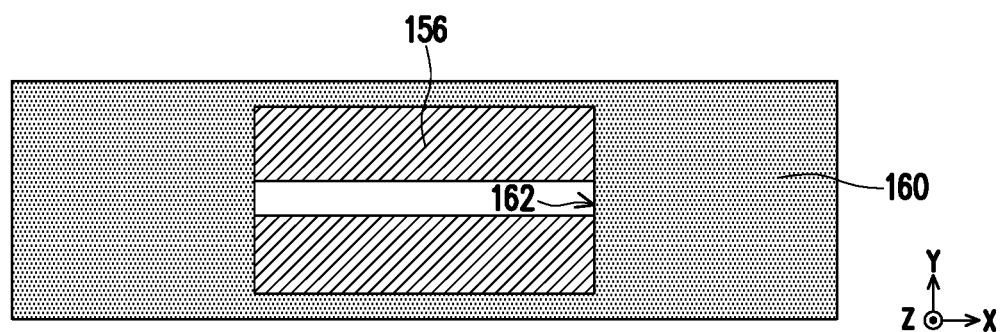
Figure 3A:
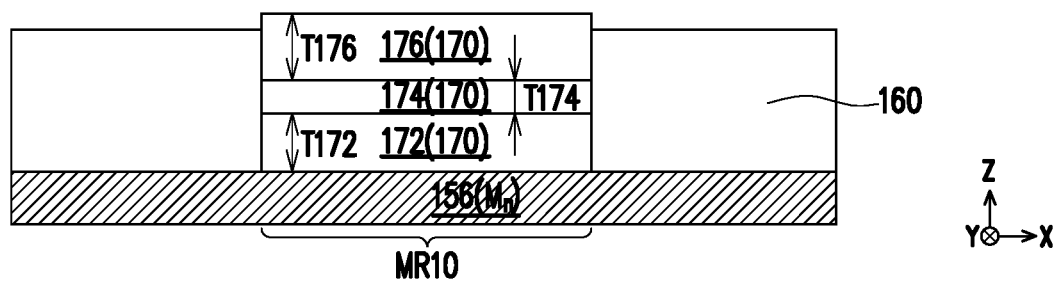
Figure 3B:
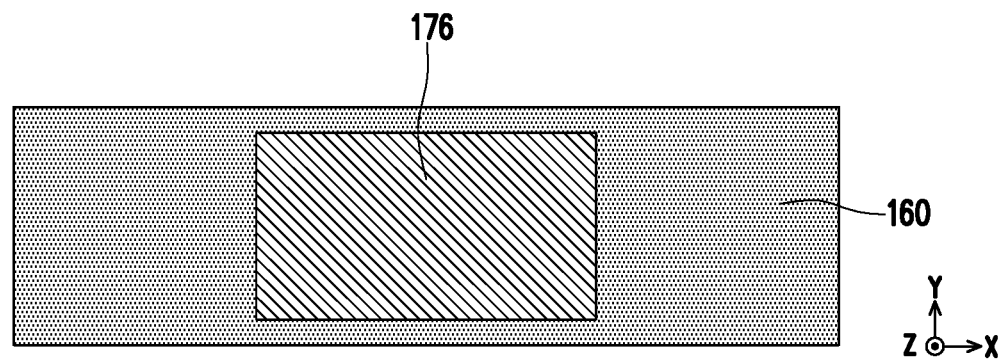

In some embodiments, as illustrated in the following, memory cells (e.g., MC10 illustrated in FIG. 15) are formed in a portion of the interconnection region IN, and such portion may be referred to as a memory region MR10 of the semiconductor device D10. FIG. 2A to FIG. 14A are schematic cross-sectional views of a portion of structures produced while manufacturing the semiconductor device D10 including the memory region MR10, and FIG. 2B to FIG. 14B are the corresponding schematic top views. For clarity of illustrations, in FIG. 2A to FIG. 14A the elements below the conductive patterns 156 are omitted from the drawings. Referring to FIG. 1 FIG. 2A and FIG. 2B, in the memory region MR10 the conductive patterns 156 of the topmost additional tier 150 may include parallel strips extending along the X direction, and separated along the Y direction by portions of interlayer dielectric 152. In some embodiments, an interlayer dielectric 160 is formed on the conductive patterns 156 of the topmost additional tier 150 outside the memory region MR10. In some embodiments, the interlayer dielectric 160 may be patterned so as to include an opening 162 in correspondence of the memory region MR10 where the memory cells are to be formed. Referring to FIG. 2A, FIG. 3A and FIG. 3B, in some embodiments, stacked layers 170 are formed on the conductive patterns 156 in the memory region MR10, within the opening 162 of the interlayer dielectric 160. In some embodiments, the stacked layers 170 include a bottom metallic layer 172, a semiconductor channel layer 174, and a top metallic layer 176 disposed, in this order, on the conductive patterns 156. The thickness T172, T174, T176 of the individual layers 172, 174, 176 are not particularly limited, and may be independently selected according to production and design requirements. For example, the thickness T174 of the semiconductor channel layer 174 may be in the range from 5 nm to 50 nm. For example, the thickness of the semiconductor channel layer 174 may be about 15 or 20 nanometers. In some embodiments, the bottom metallic layer 172 and the top metallic layer 176 may include aluminum, titanium, copper, nickel, tungsten, other suitable metallic materials, and/or alloys thereof, and be fabricated through CVD, ALD, PVD, plating or other suitable deposition techniques. In some embodiments, the semiconductor channel layer 174 includes a semiconductor oxide material. In some embodiments, the semiconductor channel layer includes a ternary or higher (e.g., quaternary and so on) semiconductor oxide material, such as indium gallium zinc oxide (IGZO), indium zinc oxide (IZO), or indium tin oxide (ITO). In some embodiments, the material of the semiconductor channel layer 174 may be deposited by suitable techniques, such as CVD, ALD, PVD, PECVD, epitaxy, or the like. As illustrated in FIG. 3B, the stacked layers 170 may initially extend throughout the entire memory region MR10. Auxiliary mask (not shown) may be used during formation of the stacked layers 170 to avoid deposition of materials on the interlayer dielectric 160.

Figure 4A:
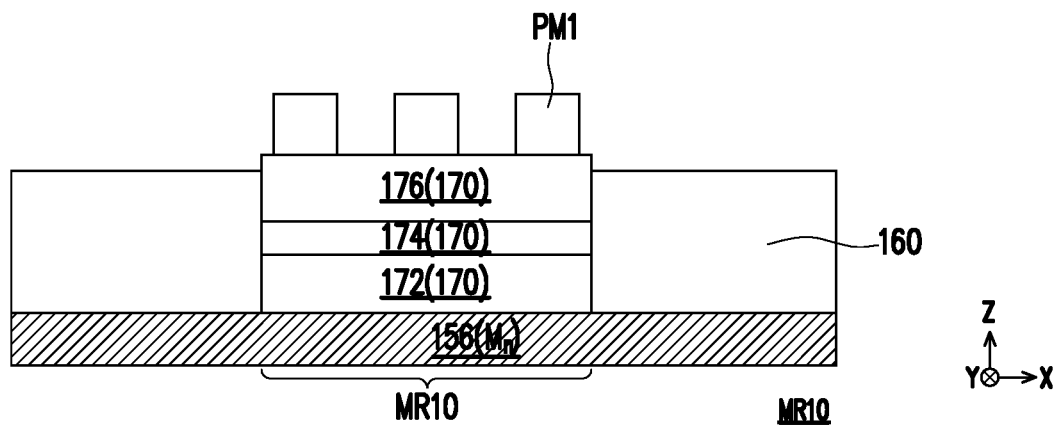
Figure 4B:
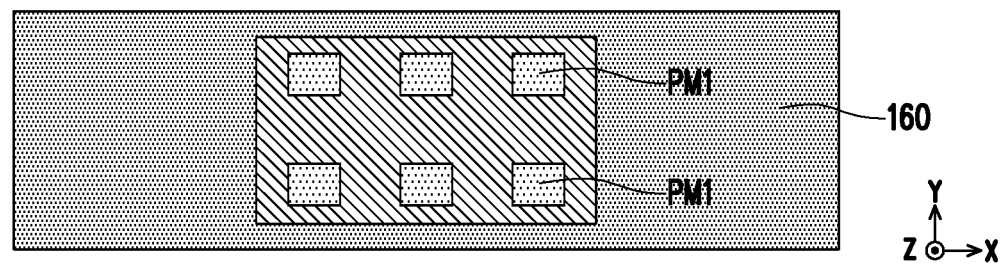
Figure 5A:
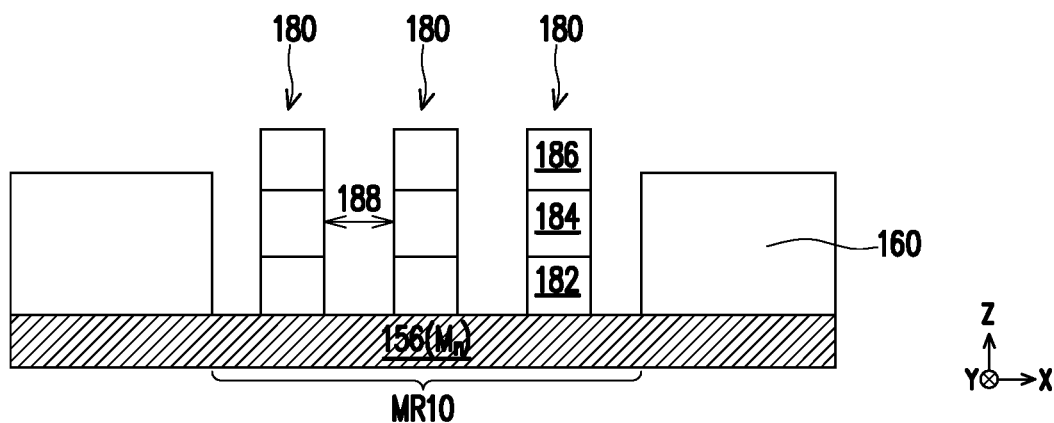
Figure 5B:
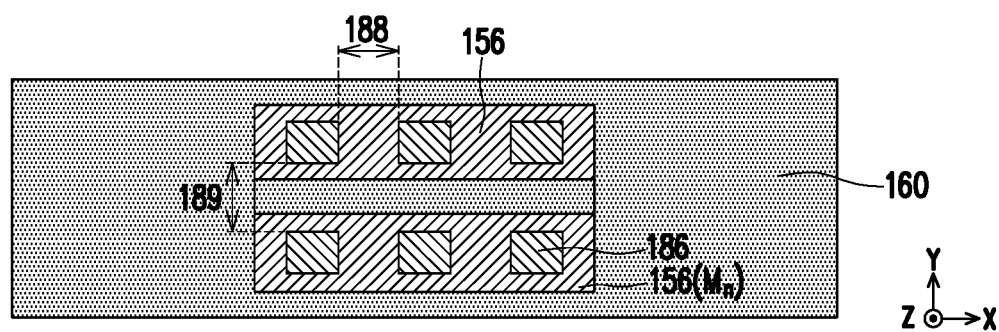

Referring to FIG. 4A and FIG. 4B, in some embodiments a patterned mask PM1 is provided on the stacked layers 170. In some embodiments, the patterned mask PM1 includes a material conferring etching selectivity with respect to at least the material of the top metallic layer 176. In some embodiments, the patterned mask PM1 may be an oxide- or nitride-based hard mask. In some alternative embodiments, the patterned mask PM1 may include a photoresist material. In some embodiments, the patterned mask PM1 may be provided through a sequence of deposition, exposure, and development steps. The patterned mask PM1 may include separate blocks or strips which are used to determine the shape of the channel of the memory cells during a subsequent etching process. As illustrated with reference to FIG. 4A, FIG. 4B, FIG. 5A, and FIG. 5B, the pattern of the patterned mask PM1 is transferred to the stacked layers 170, resulting in one or more cell pillars 180 including a bottom metallic block 182, a semiconductor channel block 184, and a top metallic block 186, respectively formed from the bottom metallic layer 172, the semiconductor channel layer 174, and the top metallic layer 176. In some embodiments, an array of cell pillars 180 is formed within the memory region MR10. The cell pillars 180 may be disposed along columns and rows of an array. The separation between adjacent cell pillars 180 may be selected as a function of the footprint of the stacked blocks 182, 184, 186. In some embodiments the gaps 188, 189 between adjacent cell pillars 180 may independently be in the range from 20 nm to 100 nm, and may be different along different directions. In FIG. 5B six cell pillars 180 are illustrated in the memory region MR10 to represent a plurality of cell pillars 180 that are formed in the memory region MR10. The disclosure does not limit the number of cell pillars 180 which may be formed within the memory region MR10, and fewer or more cell pillars 180 than the ones illustrated in the drawings are contemplated within the present disclosure.

Figure 6A:
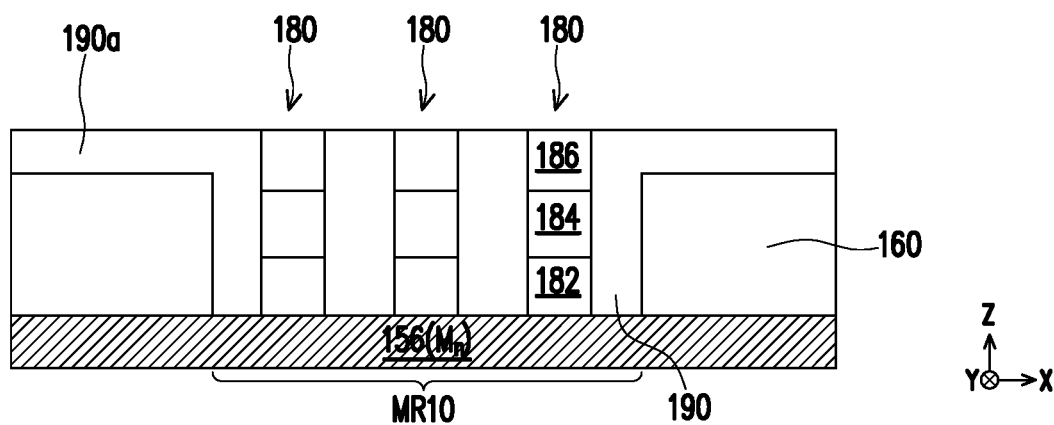
Figure 6B:
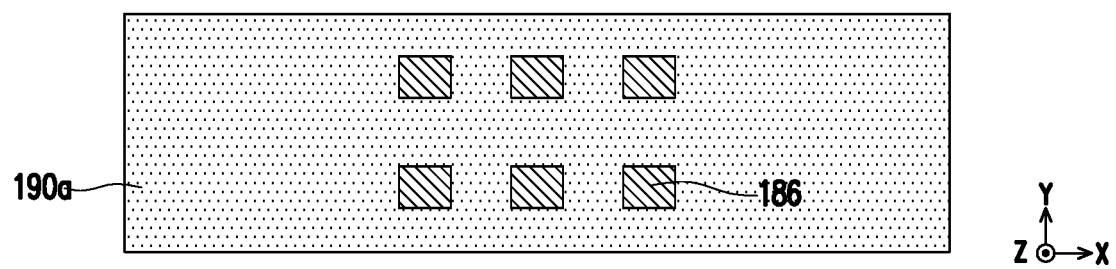
Figure 7A:
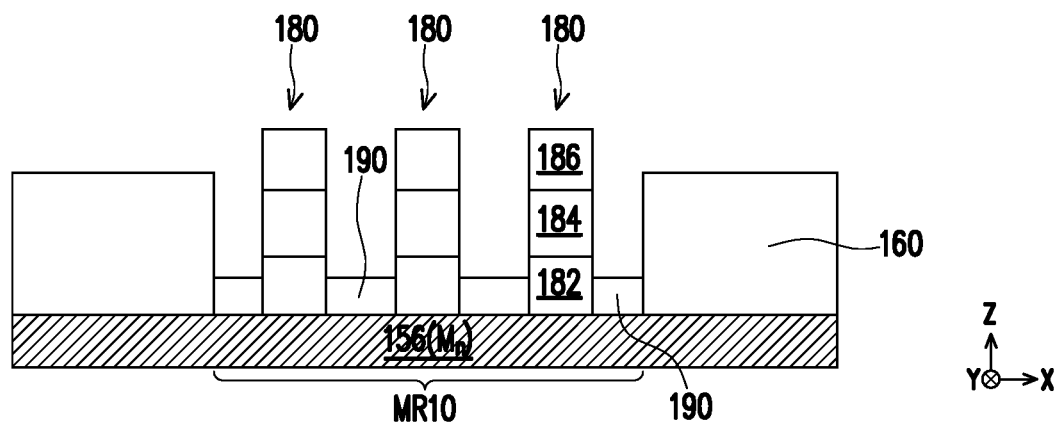
Figure 7B:
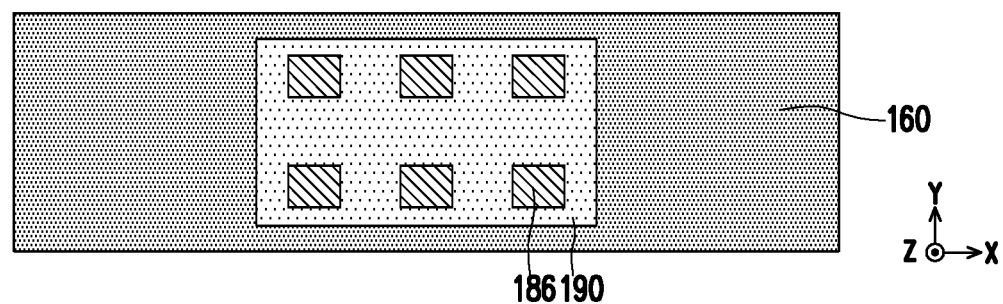

Referring to FIG. 6A and FIG. 6B, an interlayer dielectric 190a is provided on the conductive patterns 156 to encapsulate the cell pillars 180. In some embodiments, the interlayer dielectric 190a may be further formed on the interlayer dielectric 160 outside the memory region MR10. In some embodiments, the interlayer dielectric 190a is deposited so as to initially bury the cell pillars 180, which may be exposed upon removal of a portion of the interlayer dielectric 190a, for example during a planarization process. Referring to FIG. 6A, FIG. 6B, FIG. 7A, and FIG. 7B, the interlayer dielectric 190a may be further removed to laterally expose the top metallic block 186 and the semiconductor channel block 184. That is, the interlayer dielectric 190a may be recessed down to a level height along a stacking direction of the blocks of the cell pillars 180 (the Z direction) lower than an interface between the bottom metallic block 182 and the semiconductor channel block 184. In some embodiments, a material of the interlayer dielectric 190a may be different from the material of the interlayer dielectric 160, so that, upon recessing the interlayer dielectric 190a, the interlayer dielectric 160 may be exposed once again outside the memory region MR10.

Figure 8A:
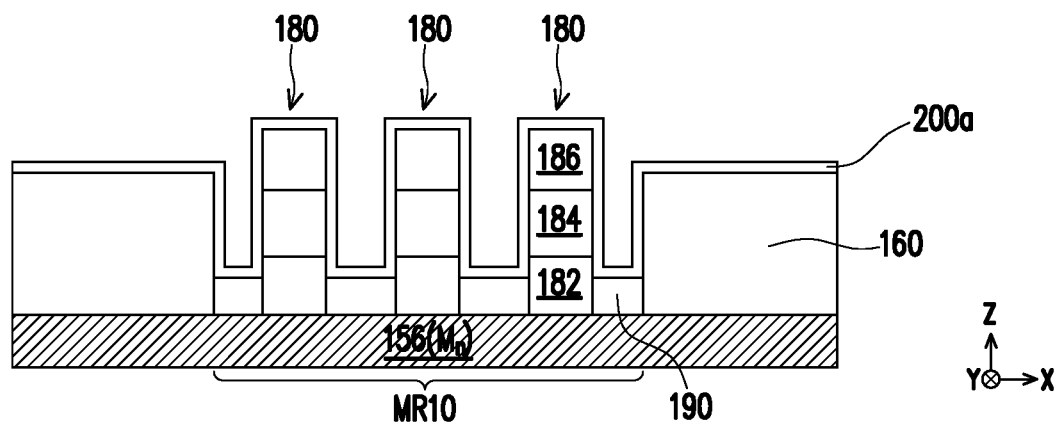
Figure 8B:
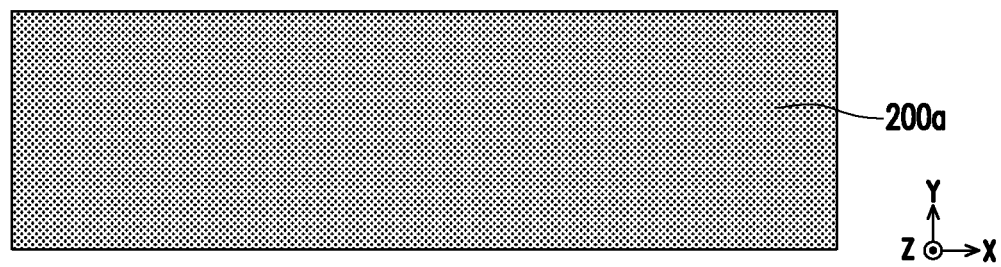
Figure 9A:
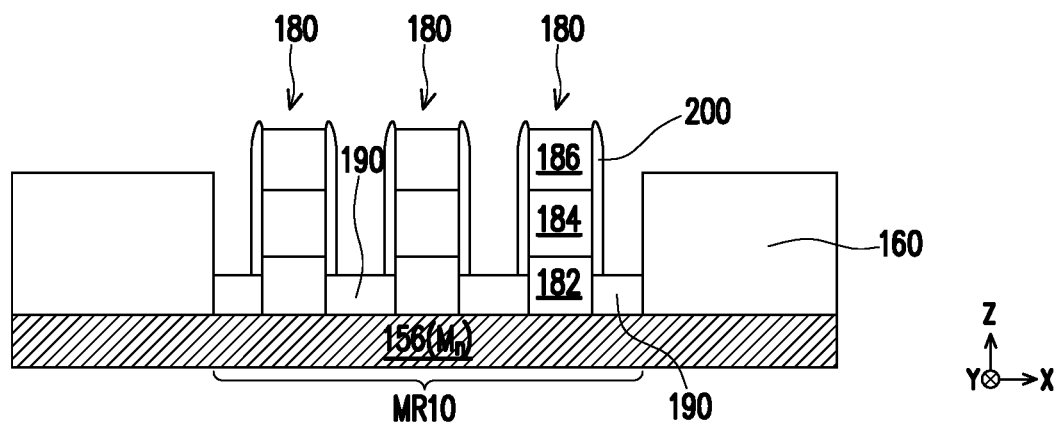
Figure 9B:
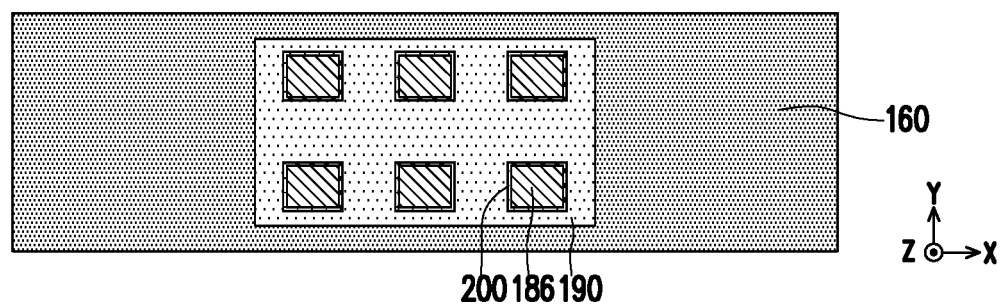

Referring to FIG. 8A and FIG. 8B, in some embodiments a high-k dielectric material 200a is deposited in the memory region MR10, blanketly covering the cell pillars 180 and the interlayer dielectric 190. In some embodiments, the high-k dielectric material 200a conformally covers the cell pillars 180, extending over the top and side surfaces of the cell pillars 180 as well as on the portions of interlayer dielectric 190 disposed in between adjacent cell pillars 180. In some embodiments, the high-k dielectric material 200a further extends on the interlayer dielectric 160 outside the memory region MR10. In some embodiments, the high-k dielectric material 200a has a dielectric constant greater than about 4, greater than about 12, greater than about 16, or even greater than about 20. For example, a material of the high-k dielectric material 200a may include a metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfSiO, or a combination thereof. In some alternative embodiments, the high-k dielectric material 200a may optionally include a silicate such as HfSiO, HfSiON LaSiO, AlSiO, or a combination thereof. In some embodiments, the method of forming the high-k dielectric material 200a includes performing at least one suitable deposition technique, such as CVD, PECVD, metal oxide chemical vapor deposition (MOCVD), ALD, remote plasma atomic layer deposition (RPALD), plasma-enhanced atomic layer deposition (PEALD), molecular beam deposition (MBD), or the like. In some embodiments, portions of the high-k dielectric material 200a may be removed, for example during an etching step, to expose the top metallic blocks 186 at the top of the cell pillars 180, as illustrated in FIG. 9A and FIG. 9B. In some embodiments, the high-k dielectric material 200a is removed from the top surfaces of the cell pillars 180 and from over the interlayer dielectrics 190 and 160, while high-k dielectric layers 200 remain on the side surfaces of the cell pillars 180. In some embodiments, the high-k dielectric layers 200 laterally wrap around the cell pillars 180, covering the side surfaces of the bottom metallic blocks 182, the semiconductor channel blocks 184, and the top metallic blocks 186.

Figure 10A:
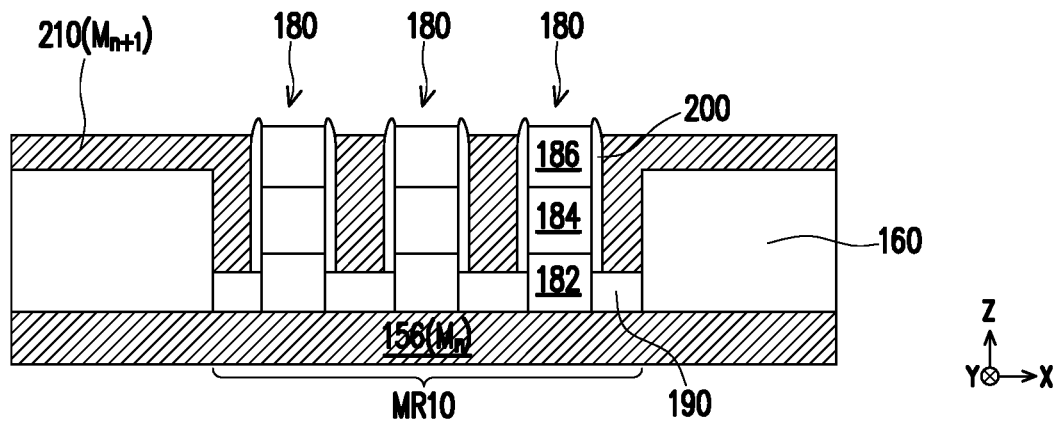
Figure 10B:
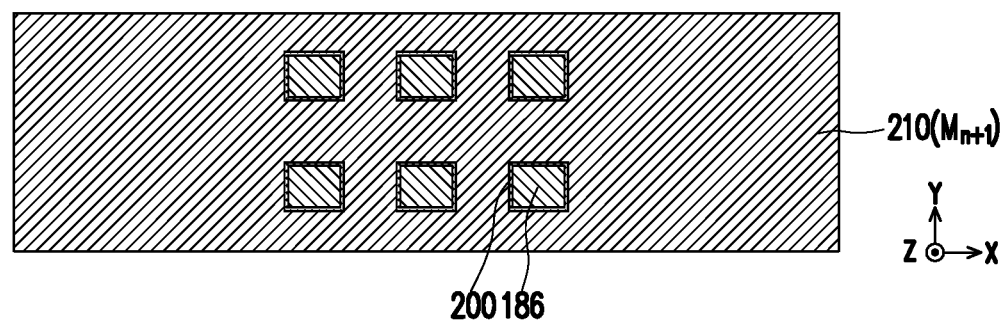
Figure 11A:
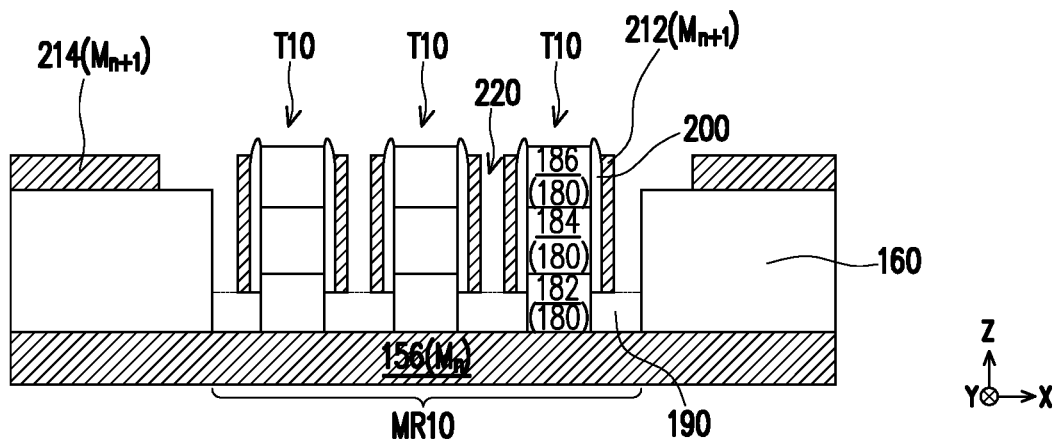
Figure 11B:
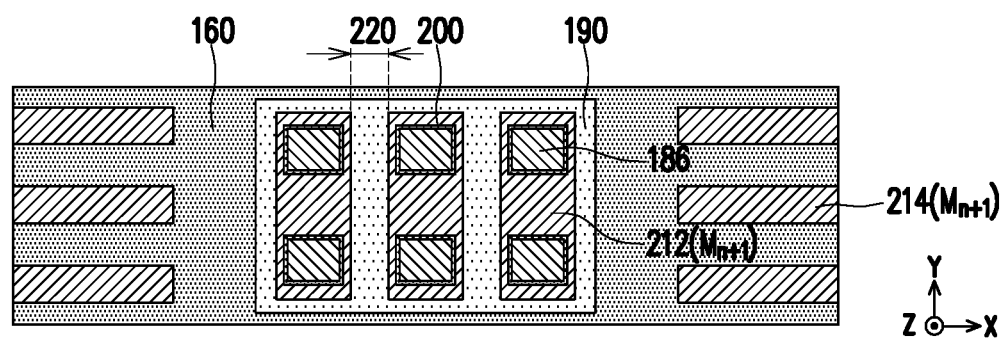

Referring to FIG. 10A and FIG. 10B, in some embodiments a metallic material 210 is deposited. In some embodiments, the metallic material 210 deposited in the memory region MR10 is part of the metallization level $M_{n+1}$, so that the metallic material 210 may be deposited also outside the memory region MR10, on the interlayer dielectric 160. In some alternative embodiments, the metallic material 210 is deposited in the memory region MR10 and a different metallic material (not shown) is deposited outside of the memory region MR10 on the interlayer dielectric 160. In some embodiments, the metallic material 210 includes copper (Cu), titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material, or a combination thereof. In some embodiments, the metallic material 210 may also include materials to fine-tune the work function of the metallic material 210. For example, the metallic material 210 may include p-type work function materials such as Ru, Mo, WN, $ZrSi_2$, $MoSi_2$, $TaSi_2$, $NiSi_2$, or combinations thereof, or n-type work function materials such as Ag, TaCN, Mn, or combinations thereof. In some embodiments, portions of the metallic material 210 may be removed after deposition to partially recess the metallic material 210, for example to reach a level height lower than the top surface of the top metallic block 186 along the stacking direction of the blocks 182, 184, 186. In some embodiments, the high-k dielectric layers 200 and the top metallic blocks 186 protrude from the top surface of the metallic material 210. Referring to FIG. 10A, FIG. 10B, FIG. 11A, and FIG. 11B, the metallic material 210 is patterned to leave gate patterns 212 surrounding the cell pillars 180 and the high-k dielectric layers 200 in the memory region MR10, and conductive patterns 214 extending on the interlayer dielectric 160 outside the memory region MR10. In some embodiments, the interlayer dielectric 160 may be patterned to include openings (not shown) outside the memory region MR10, to allow electrical connection of the conductive patterns 214 with the lower tiers (e.g., tiers 130, 140) of the interconnection region IN (illustrated, e.g., in FIG. 1).

The gate patterns 212 may extend from the bottom metallic block 182 up to the top metallic block 186. In some embodiments, a gate pattern 212 surrounding a cell pillar 180 (with a high-k dielectric layer 200 interposed in between) forms a gate-all-around transistor T10, in which the top and bottom metallic blocks 182, 186 act as source and drain contacts, and the semiconductor channel block 184 acts as the channel region. That is, during operation of the transistor, an electric current may flow in the vertical direction (e.g., the stacking direction of the blocks 182, 184, 186), for example from the bottom metallic block 182 acting as source contact to the top metallic block 186 acting as drain contact. As such, the transistor T10 may be considered a vertical gate-all-around transistor. In some embodiments, the cell pillars 180 may be disposed in an array configuration, for example along the columns and rows of a matrix, and the gate patterns 212 may be parallel strips elongated along the directions of the columns or the rows, with a gate pattern 212 contacting the cell pillars 180 of one column or row. For example, if the gate patterns 212 extend along the direction of the columns of the array of cell pillars 180 of FIG. 11B (e.g., the Y direction), cell pillars 180 within a same column (e.g., located at a same level height along the X direction) will be surrounded by the same gate pattern 212, while cell pillars 180 belonging to adjacent columns (e.g., located at different level heights along the X direction) will be contacted by different gate patterns 212. In this configuration, gaps 220 along the direction of the rows (e.g., the X direction in FIG. 10B) exist in between adjacent gate patterns 212. The gaps 220 may be in the range from 10 nm to 100 nm, for example about 20 nm.

Figure 12A:
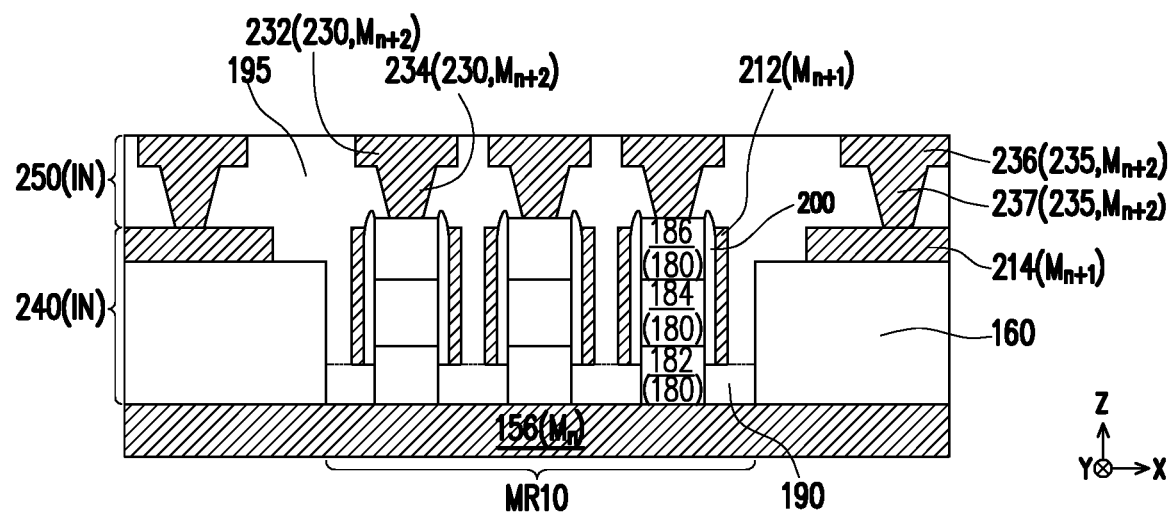
Figure 12B:
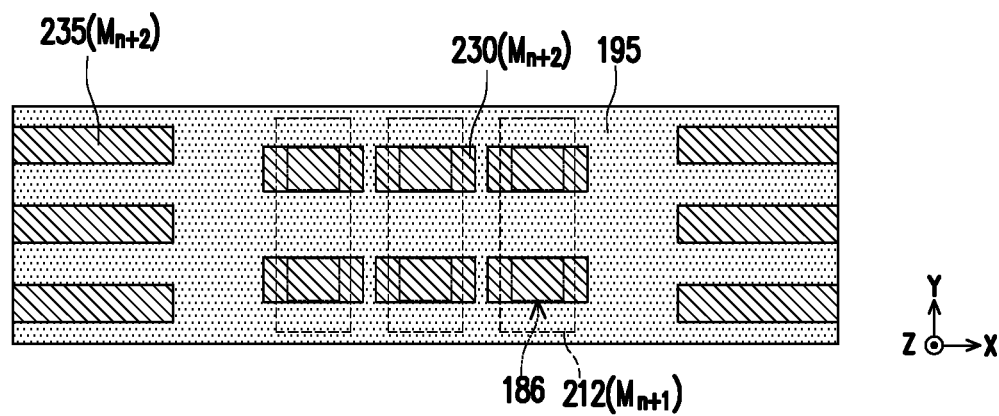

Referring to FIG. 12A and FIG. 12B, the gaps 220 surrounding the gate patterns 212 may be filled by an interlayer dielectric 195. In some embodiments, the interlayer dielectric 195 buries the cell pillars 180 and the gate patterns 212 within the memory region MR10. In some embodiments, the interlayer dielectric 195 further covers the conductive patterns 214. In some embodiments, the tier 240 at which the encapsulated cell pillars 180 and the gate patterns 212 are located may be referred to as active device tier. In some embodiments, a connection tier 250 is formed on the active device tier 240. The connection tier 250 includes conductive patterns 230 and 235 belonging to the metallization level $M_{n+2}$, two level higher with respect to the metallization level $M_n$ on which the cell pillars 180 are formed. In some embodiments, the interlayer dielectric 195 is formed tall enough to extend in the connection tier 250, so that the conductive patterns 230, 235 are formed through the interlayer dielectric 195. In some embodiments, the conductive patterns 230 are located in the memory region MR10 and include as many conductive plates 232 as there are cell pillars 180, with each cell pillar 180 having an overlying conductive plate 232. Conductive vias 234 connect the top metallic blocks 186 to the overlying conductive plates 232. Adjacent conductive plates 232 may be separated by portions of the interlayer dielectric 195. In FIG. 12B, the outlines of the gate patterns 212 and the top metallic blocks 186 are illustrated as dashed lines and dash-double dotted lines, respectively, for sake of completeness. However, as indicated by the cross-sectional view of FIG. 12A, the gate patterns 212 and the top metallic blocks 186 may not be visible when the structure of FIG. 12A is viewed from the top (e.g., along the Z direction). The conductive patterns 235 may be located outside the memory region MR10, and may include routing traces 236 and interconnect vias 237 electrically connecting the routing traces 236 to the conductive patterns 214.

Figure 13A:
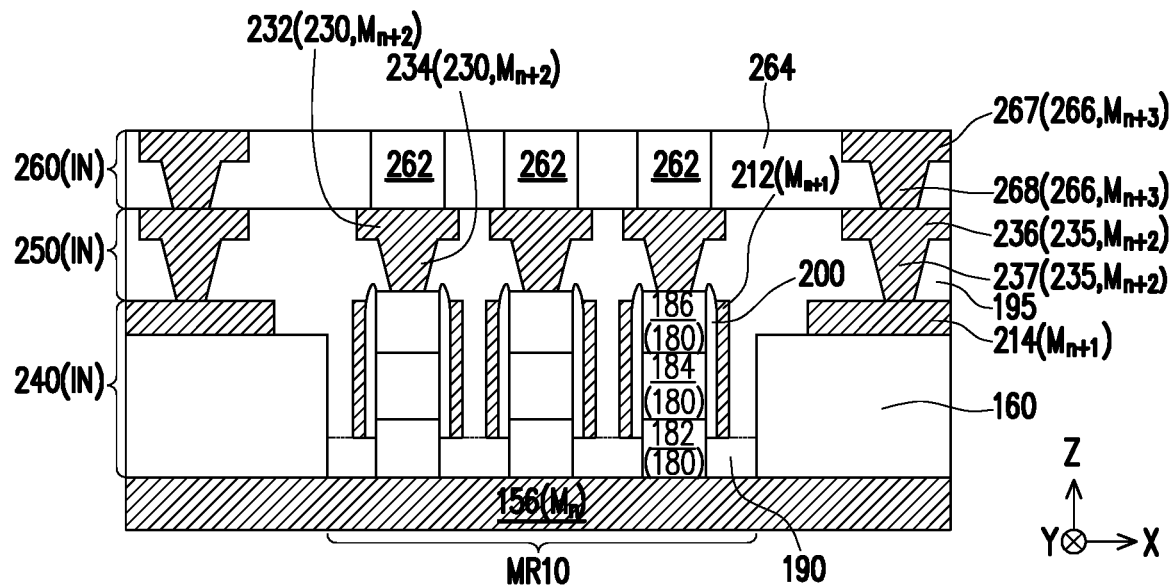
Figure 13B:
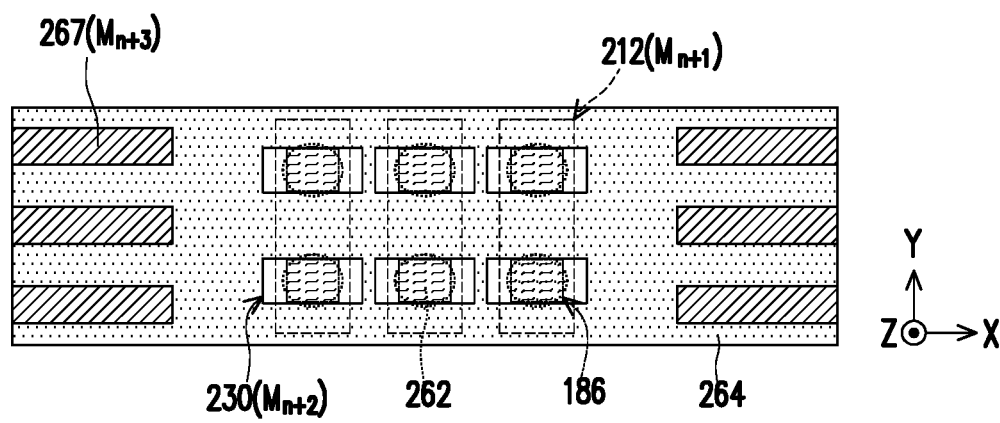

Referring to FIG. 13A and FIG. 13B, a magnetic junction tier 260 is formed on the connection tier 250. In some embodiments, the magnetic junction tier 260 includes magnetic tunnel junctions 262 embedded in an interlayer dielectric 264 in correspondence of the memory region MR10. In some embodiments, there are as many magnetic tunnel junctions 262 as there are cell pillars 180, with each cell pillar 180 being connected by the conductive patterns 230 to an associated magnetic tunnel junction 262. In some embodiments, the magnetic tunnel junctions 262 may be disposed on the conductive plates 232 of the connection tier 250, one magnetic tunnel junction 262 per conductive plate 232. In some embodiments, the magnetic junction tier 260 further includes conductive patterns 266 outside the memory region MR10. The conductive patterns 266 includes routing traces 267 and interconnect vias 268 electrically connected to the conductive patterns 235, and correspond to the metallization level $M_{n+3}$ of the interconnection region IN.

Figure 14A:
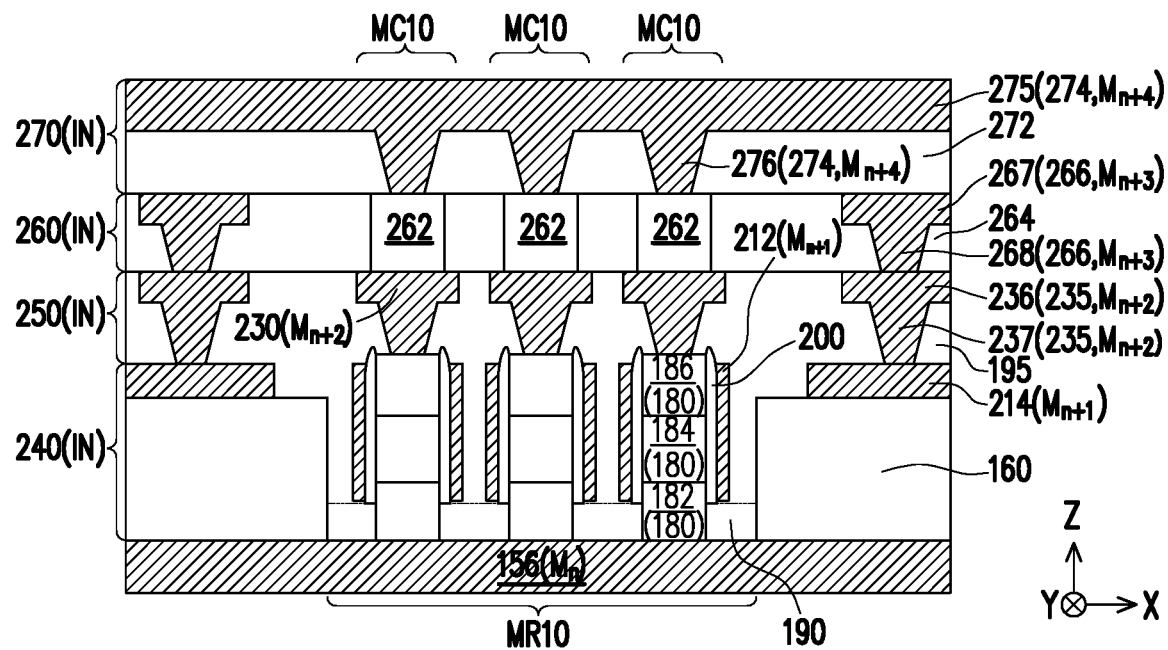
Figure 14B:
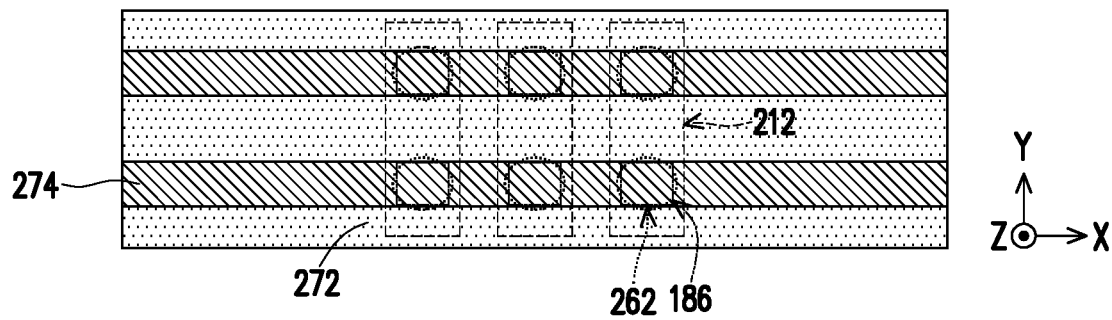

Referring to FIG. 14A and FIG. 14B, one or more upper tiers of the interconnection region IN are formed on the magnetic junction tier 260. In some embodiments, at least one of the upper tiers (e.g., the upper tier 270) includes conductive patterns 274 contacting multiple magnetic tunnel junctions 262. For example, the conductive patterns 274 belonging to the metallization level $M_{n+4}$ may include conductive strips 275 extending parallel to each other along the direction of the rows (e.g., the X direction) of the array of cell pillars 180, and one of such conductive strips 275 may be connected by conductive vias 276 to the magnetic tunnel junctions 262 disposed on a row of cell pillars 180. In some embodiments, as many conductive strips 275 are formed as there are rows in the array of cell pillars 180. As illustrated in FIG. 14B, the conductive strips 275 may extend in a direction perpendicular to the extending direction of the underlying gate patterns 212. In some embodiments, further processes (e.g., post-fab processes) may be performed after formation of the upper tiers of the interconnection region IN.

Figure 15:
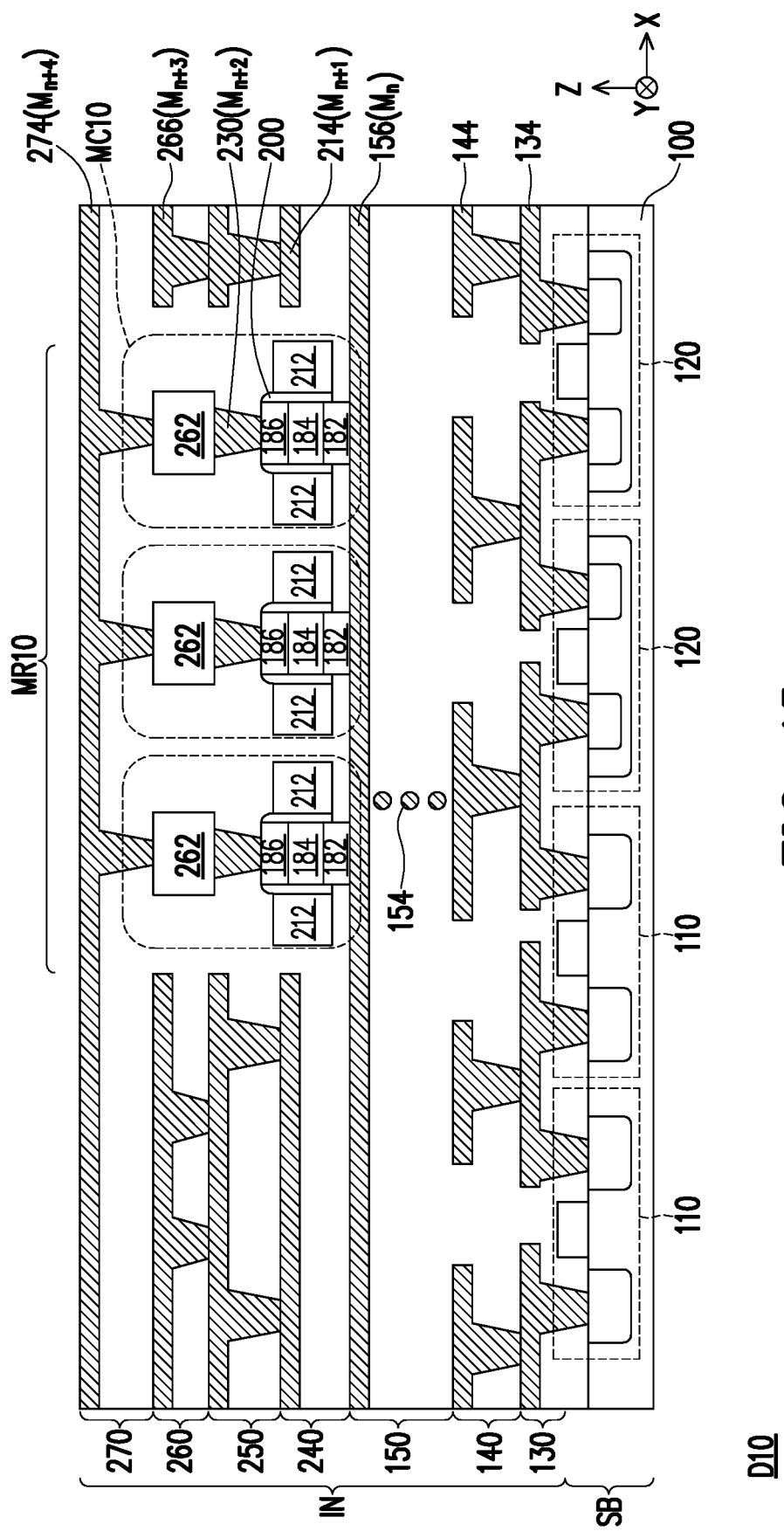
FIG. 15 is a schematic cross-sectional view of a semiconductor device according to some embodiments of the disclosure.
Figure 16A:
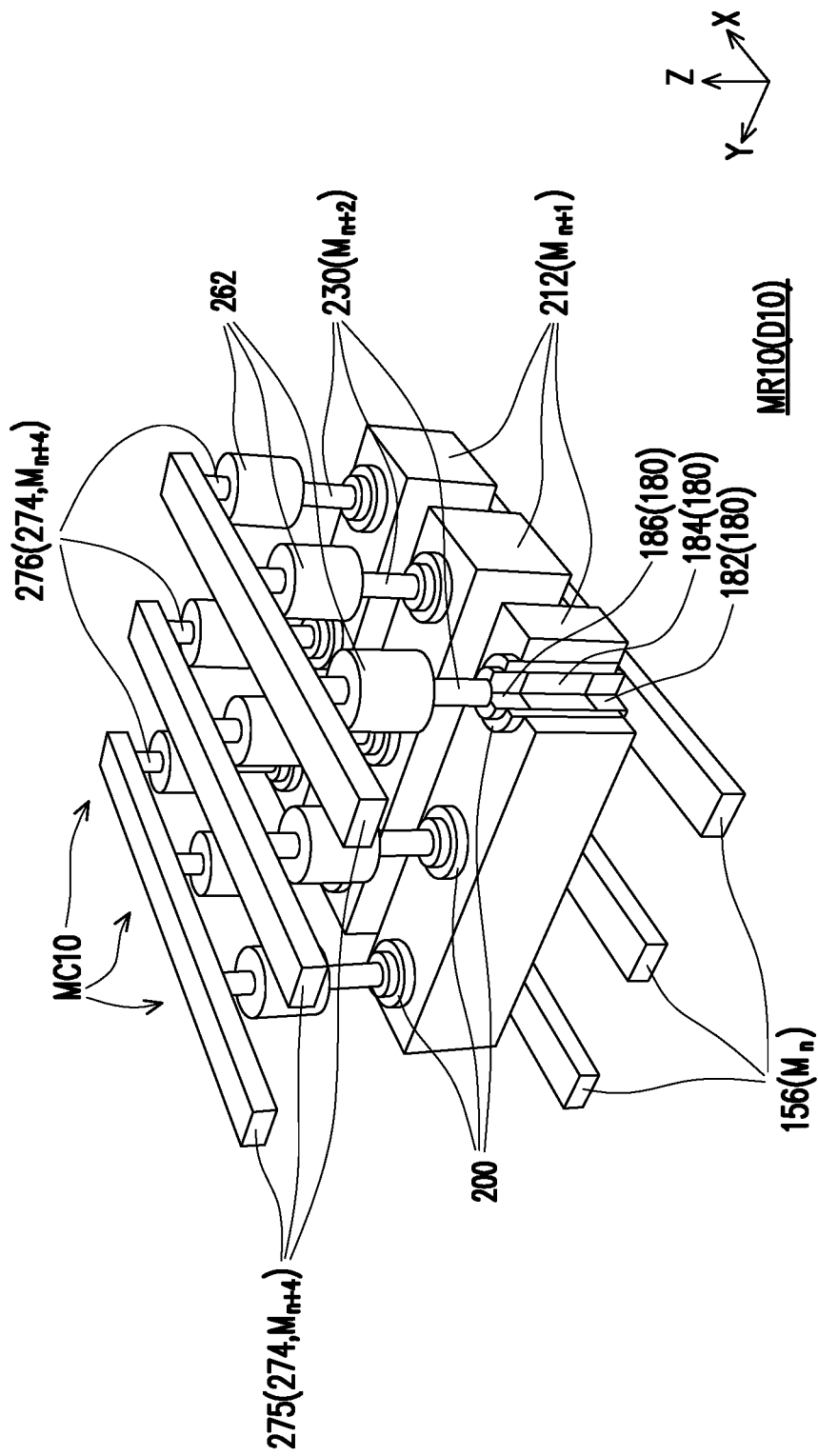
FIG. 16A is a schematic perspective view of a memory region of the semiconductor device of FIG. 15 according to some embodiments of the disclosure.
Figure 16B:
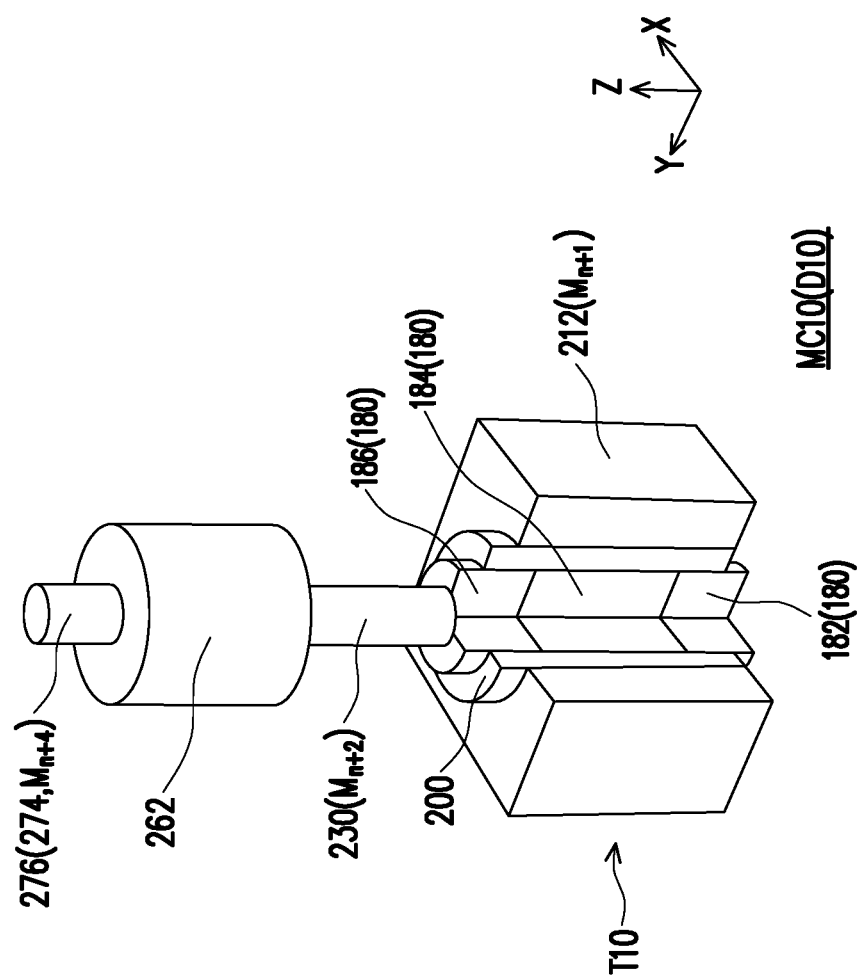
FIG. 16B is a schematic perspective view of a memory cell of the semiconductor device of FIG. 15 according to some embodiments of the disclosure.

FIG. 15 is a schematic cross-sectional view of the semiconductor device D10 according to some embodiments of the disclosure. FIG. 16A is a schematic perspective view of the memory region MR10 of the semiconductor device D10 according to some embodiments of the disclosure. FIG. 16B is a schematic perspective view of a memory cell MC10 of the semiconductor device D10 according to some embodiments of the disclosure. In the perspective views of FIG. 16A and FIG. 16B, the interlayer dielectrics have been omitted for clarity of illustration. Referring to FIG. 15, FIG. 16A, and FIG. 16B, the semiconductor device D10 includes the substrate region SB and the interconnection region IN formed on the substrate region SB. In the substrate region SB, active and passive devices (e.g., the transistors 110, 120) are formed in and/or on the semiconductor substrate 100. The devices formed in the semiconductor substrate 100 may be electrically connected to each other by the conductive patterns (e.g., 134, 144 and so on) of the interconnection region IN, so as to be part of an integrated circuit.

In some embodiments, the semiconductor device D10 includes a memory region MR10 located within the interconnection region IN. In the memory region MR10, an array of memory cells MC10 is formed. Each memory cell MC10 includes a transistor T10 and a magnetic tunnel junction 262. That is, the semiconductor device D10 may be or include a high-density non-volatile memory such as a magneto-resistive random-access memory (MRAM). In some embodiments, the transistor T10 is formed on the conductive patterns 156 of the metallization level $M_n$ of the interconnection region IN, and includes the cell pillar 180 wrapped by the high-k dielectric layer 200 and the gate pattern 212. The transistor T10 and the magnetic tunnel junction 262 may be connected by conductive patterns (e.g., the conductive patterns 230) of one or more connection tiers of the interconnection region IN. In the semiconductor device D10, there is one connection tier 250 joining the transistors T10 to the overlying magnetic tunnel junctions 262, but the disclosure is not limited thereto. As illustrated in FIG. 16A, in the memory region MR10 the conductive patterns 156 may include elongated strips extending along the X direction, and rows of cell pillars 180 may be disposed over such strips. The gate patterns 212 correspond to the successive metallization level $M_{n+1}$ with respect to the conductive patterns 156, and extend substantially perpendicular to the conductive patterns 156, for example along the Y direction. One gate pattern 212 contacts cell pillars 180 formed at the same level height along the X direction on different strips of the conductive patterns 156. A magnetic tunnel junction 262 is formed for each cell pillar 180, and is contacted by one of the conductive patterns 274 of a higher metallization level (e.g., the metallization level $M_{n+4}$). In some embodiments, the conductive strips 275 extend substantially parallel to the strips of the conductive patterns 156 along the X direction, perpendicular to the gate patterns 212. In some alternative embodiments, the conductive strips 275 may extend in an orthogonal direction with respect to the strips of the conductive patterns 156, along the Y direction. In some embodiments, a conductive strip 275 may contact the magnetic tunnel junctions 262 associated to cell pillars 180 formed on a same conductive pattern 156. In some embodiments, the transistor T10 acts as selector for the magnetic tunnel junction 262 of the same memory cell MC10, with electric current flowing from the drain contact 186 of the transistor T10 towards the magnetic tunnel junction 262. That is, the gate patterns 212 may correspond to the word lines of the MRAM, and the conductive strips 275 to bit lines of the MRAM. In some embodiments, by using the transistor T10 as selector for the memory cell MC10, the high write current required to operate the MRAM may be achieved without increasing the transistor density on the semiconductor substrate 100. Indeed, in some embodiments, the transistors 110, 120 formed on the semiconductor substrate 100 may be used to perform different logic functions than regulating access to the MRAM. In some embodiments, the reduced distance between the transistor T10 (the selector) and the magnetic tunnel junction 262 may also increase the response speed of the memory cell M10. In some embodiments, the transistors T10 may be vertical gate all-around transistors, and may include an oxide semiconductor as channel material in the semiconductor channel blocks 184. In some embodiments, by employing oxide semiconductors for the semiconductor channel blocks 184 fabrication of the transistors T10 may be smoothly integrated with the back-end-of-line processes to form the interconnection region IN. Furthermore, the transistors T10 may achieve good performances, for example in terms of ultra-low current leakage.

Figure 17A:
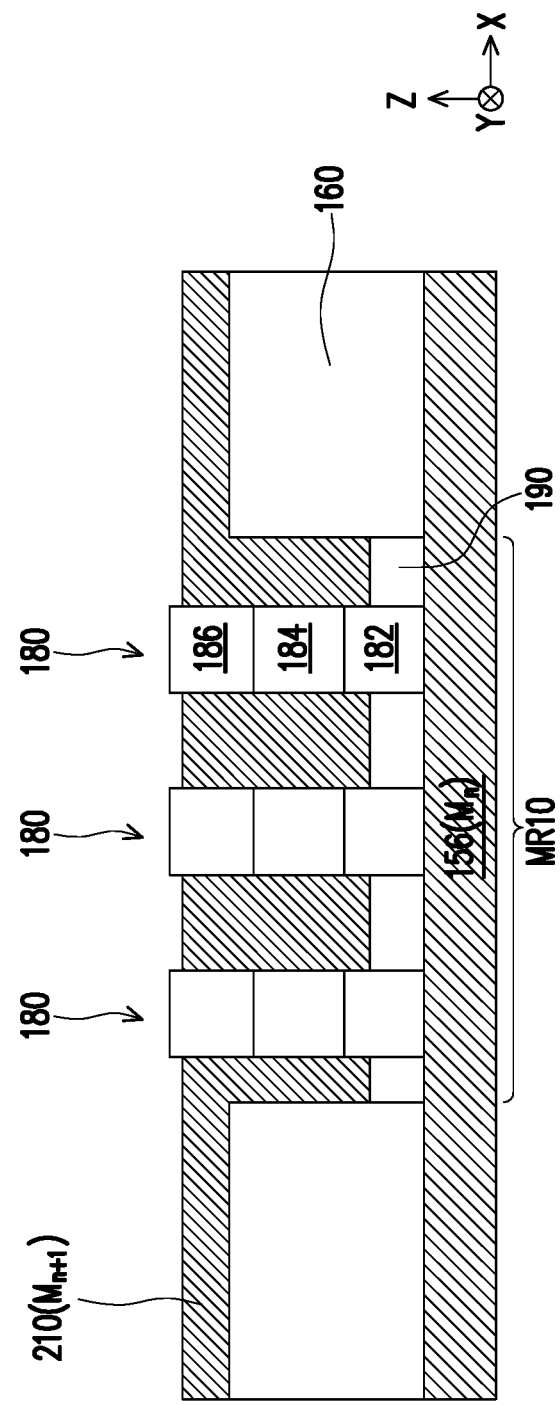
FIG. 17A and FIG. 17B are schematic cross-sectional views of structures formed during a manufacturing process of a semiconductor device in accordance with some embodiments of the disclosure.
Figure 17B:
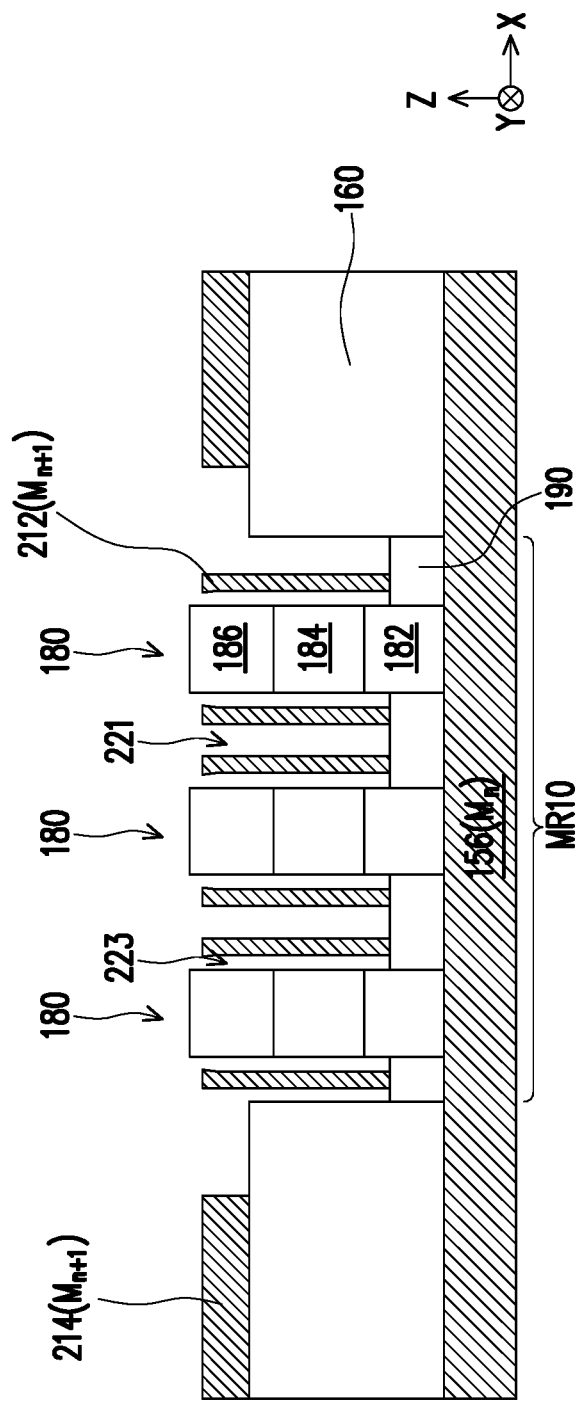

FIG. 17A and FIG. 17B are schematic cross-sectional views of structures produced during a manufacturing process of the semiconductor device D10 according to some alternative embodiments. The structure of FIG. 17A may be obtained by forming the metallic material 210 on the structure of FIG. 7A. Thereafter, the metallic material 210 may be patterned, to form the gaps 221 in between adjacent gate patterns 212, and, furthermore, annular gaps 223 in between the gate patterns 212 and the cell pillars 180. That is, the annular gaps 223 may separate the cell pillars 180 from the gate patterns 212. Filling of the annular gaps 223 with high-k dielectric material results in a structure corresponding to the one illustrated in FIG. 11A, with high-k dielectric layers 200 disposed in between the cell pillars 180 and the gate patterns 212. Thereafter, the semiconductor device D10 may be fabricated through process steps similar to the ones previously described with reference to FIG. 12A to FIG. 15.

Figure 18:
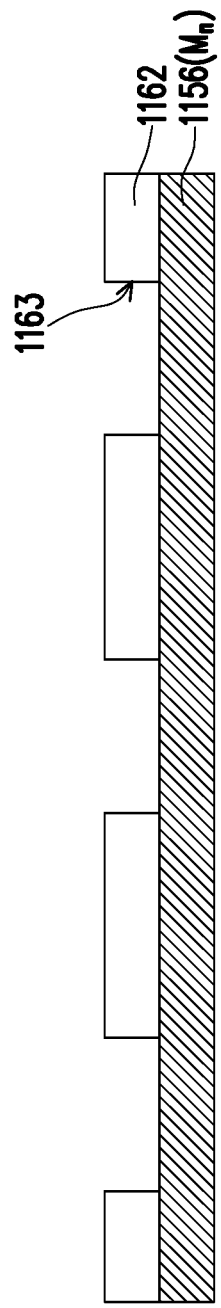
FIG. 18 to FIG. 30 are schematic cross-sectional views of a memory region of structures formed during a manufacturing process of a semiconductor device in accordance with some embodiments of the disclosure.
Figure 19:
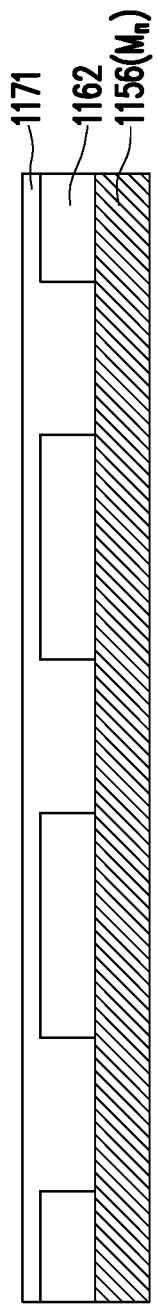
Figure 30:
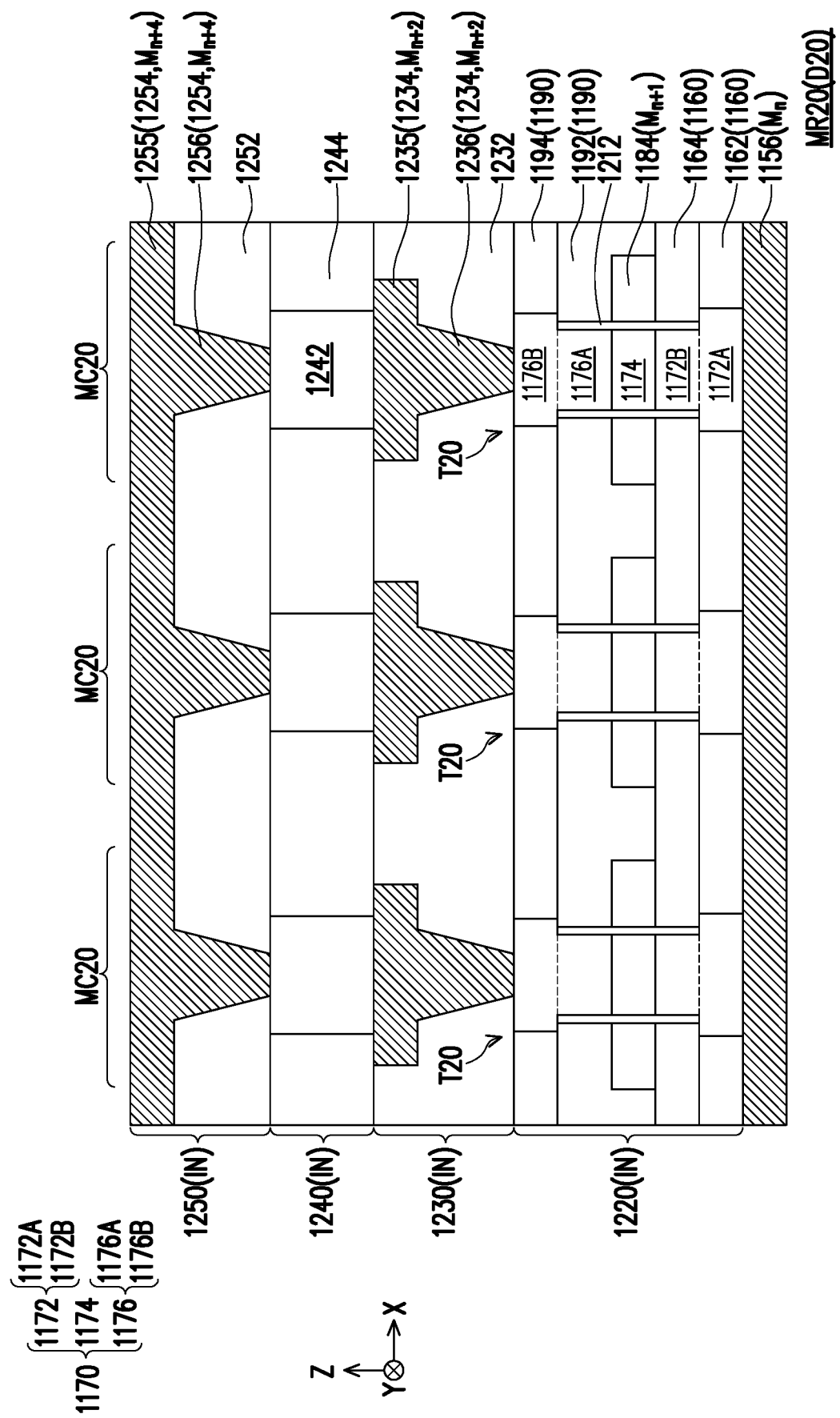
Figure 31:
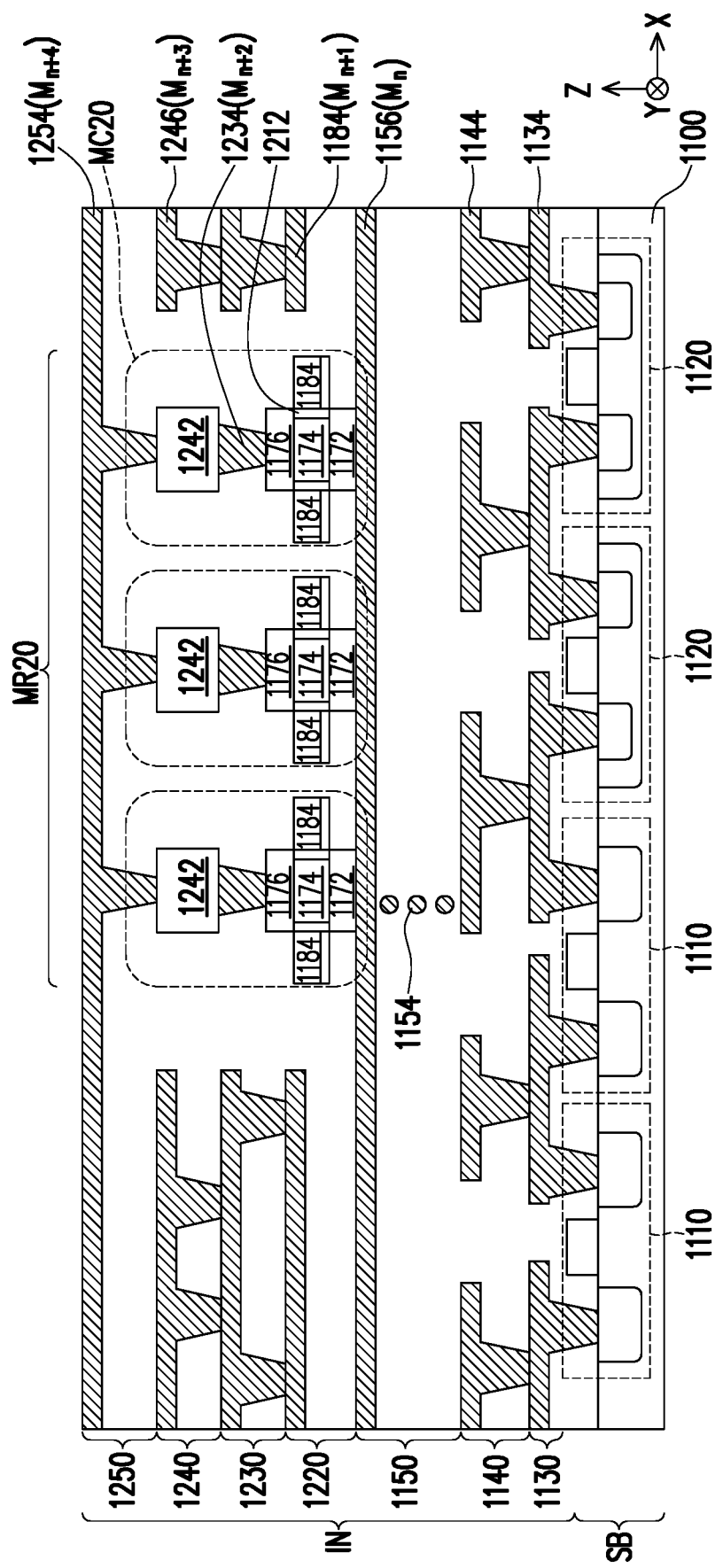
FIG. 31 is a schematic cross-sectional view of a semiconductor device according to some embodiments of the disclosure.

FIG. 18 to FIG. 30 are schematic cross-sectional views of the memory region MR20 of structures produced during a manufacturing method of a semiconductor device D20, illustrated, e.g., in FIG. 31. For clarity of illustration, in FIG. 18 to FIG. 30 is illustrated only a portion of the memory region MR20. In some embodiments, the structure of FIG. 18 may be fabricated starting from a structure such as the one of FIG. 1. That is, an interlayer dielectric 1162 is formed on the conductive patterns 1156 of a metallization level $M_n$ of an interconnection region IN (illustrated, e.g., in FIG. 30). In some embodiments, n may be an integer in the range from 4 to 15. In some embodiments, the interlayer dielectric 1162 includes a plurality of openings 1163 in the memory region MR20. The conductive patterns 1156 may be exposed at the bottom of the openings 1163. In some embodiments, there are as many openings 1163 as the number of memory cells that are to be formed. In some embodiments, the openings 1163 may be formed in an array configuration, for example along the rows and columns of a matrix. Referring to FIG. 18 and FIG. 19, in some embodiments a metallic material 1171 is formed on the conductive patterns 1156 in the openings 1163 of the interlayer dielectric 1162. In some embodiments, the metallic material 1171 fills the openings 1163 and further covers the interlayer dielectric 1162. In some embodiments, the metallic material 1171 may include similar materials as previously described for the top and bottom metallic layers 172, 176 (illustrated, e.g., in FIG.

Figure 20:
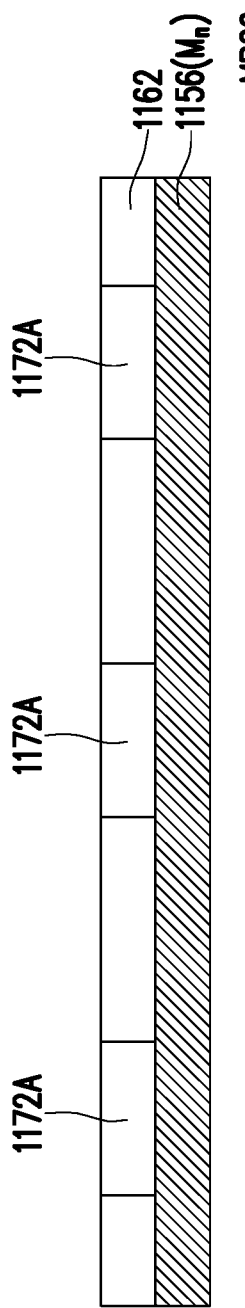

3A). Portion of the metallic material 1171 may be removed, for example during a planarization process, until the interlayer dielectric 1162 is exposed, as illustrated in FIG. 20. After planarization, first metallic blocks 1172A may remain on the conductive patterns 1156 to fill the openings 1163 of the interlayer dielectric 1162.

Figure 21:
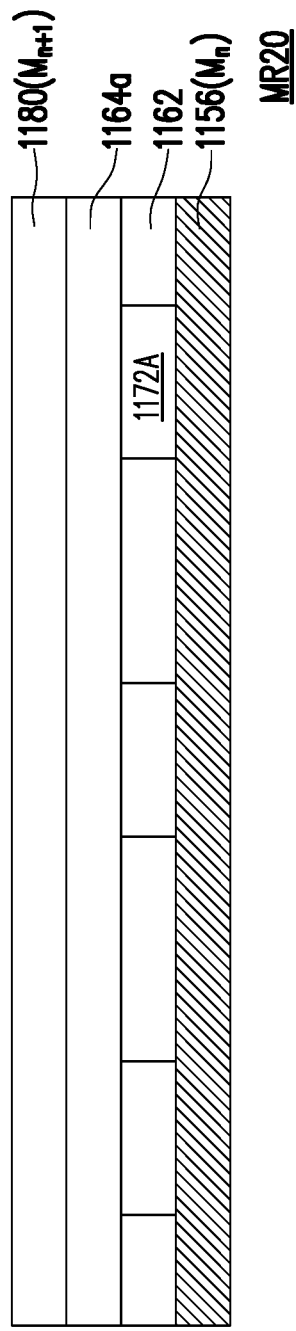
Figure 22:
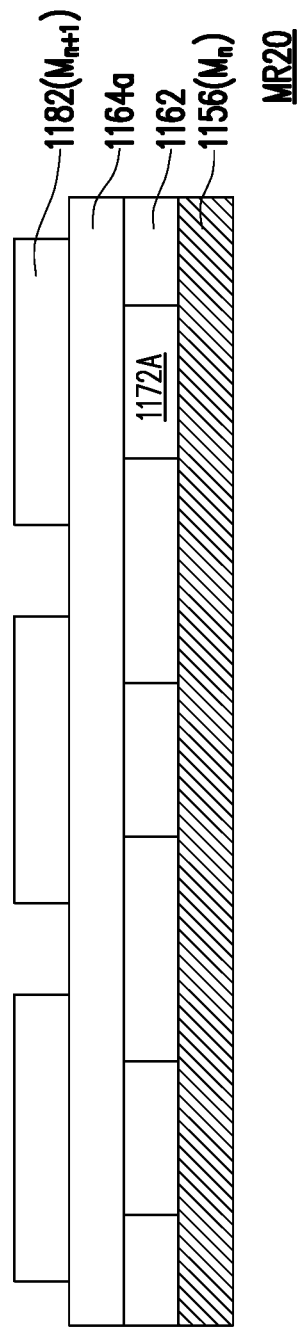

Referring to FIG. 21, an interlayer dielectric 1164a is blanketly formed on the interlayer dielectric 1162 and the first metallic blocks 1172A. Thereafter, a metallic material 1180 is blanketly formed on the interlayer dielectric 1164a. In some embodiments, the metallic material 1180 includes a gate metal as discussed above with reference to the metallic material 210 (illustrated, e.g., in FIG. 10A). In some embodiments, the metallic material 1180 may be deposited within the memory region MR20 and also outside the memory region MR20, to form the patterns of the metallization level $M_{n+1}$. In some alternative embodiments, the metallic material 1180 may be formed within the memory region MR20, and a different metallic material (not illustrated) may be formed outside the memory region MR20. Referring to FIG. 21 and FIG. 22, the metallic material 1180 may be patterned to form gate strips 1182 within the memory region MR20. In some embodiments, the gate strips 1182 are elongated strips, extending along the Y direction over multiple first metallic blocks 1172A located at a same level height along the X direction. The interlayer dielectric 1164a may separate the gate strips 1182 from the first metallic blocks 1172A.

Figure 23:
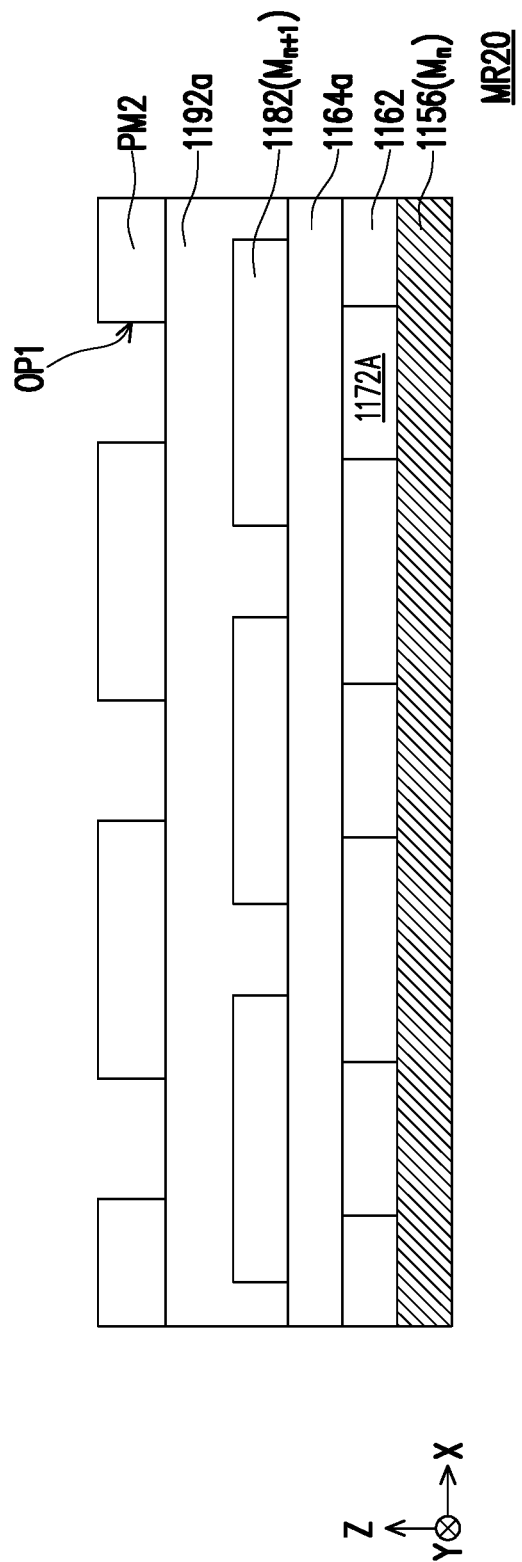
Figure 24:
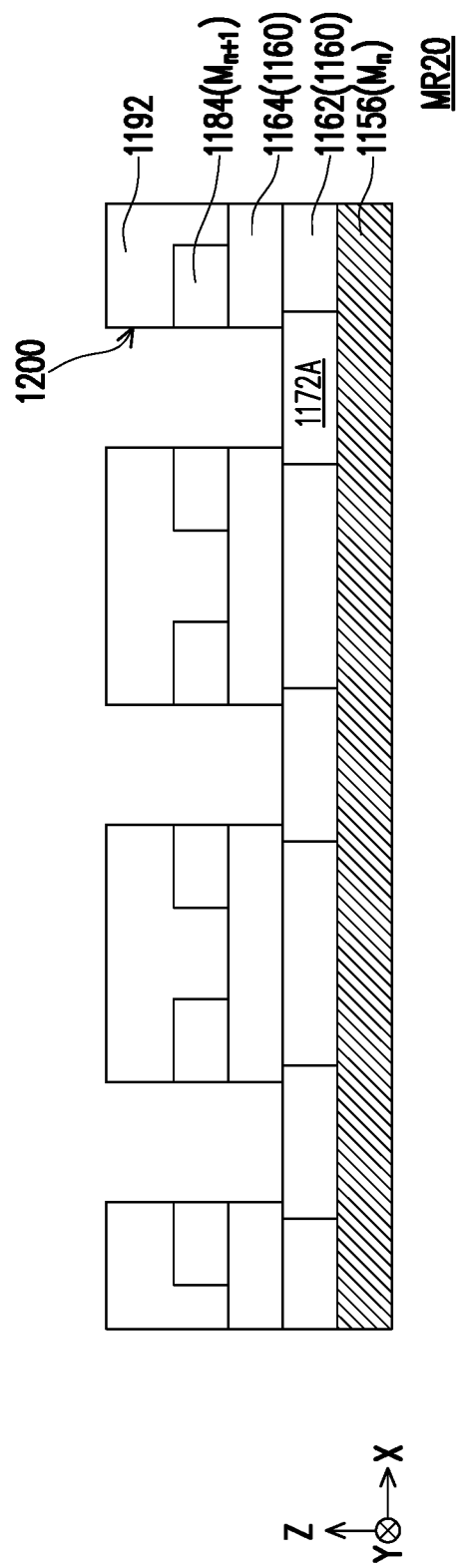

Referring to FIG. 23, an interlayer dielectric 1192a is formed on the interlayer dielectric 1164a, covering top and side surfaces of the gate strips 1182. A patterned mask PM2 is provided on the interlayer dielectric layer 1164a. The patterned mask PM2 includes openings OP1 in correspondence of the first metallic blocks 1172A. That is, vertical projections of the openings OP1 along the Z direction fall on the first metallic blocks 1172A. In some embodiments, the patterned mask PM2 may include a positive or a negative photoresist material, and may be formed through a sequence of deposition, exposure, and development steps. Referring to FIG. 23 and FIG. 24, the patterned mask PM2 may be used to form openings 1200 by removing portions of the interlayer dielectrics 1192a and 1164a, as well as the gate strips 1182 via etching processes. The resulting openings 1200 extend through the interlayer dielectrics 1192 and 1164, and through the gate patterns 1184 formed from the gate strips 1182. The first metallic blocks 1172A are exposed at the bottom of the openings 1200. In some embodiments, there are as many openings 1200 as there are first metallic blocks 1172A, and each opening 1200 exposes a different first metallic block 1172A. Multiple openings 1200 may be formed within a same gate strip 1182, so that the resulting gate pattern 1184 includes a plurality of openings 1200. After formation of the openings 1200, the patterned mask PM2 may be removed, for example via ashing or stripping.

Figure 25:
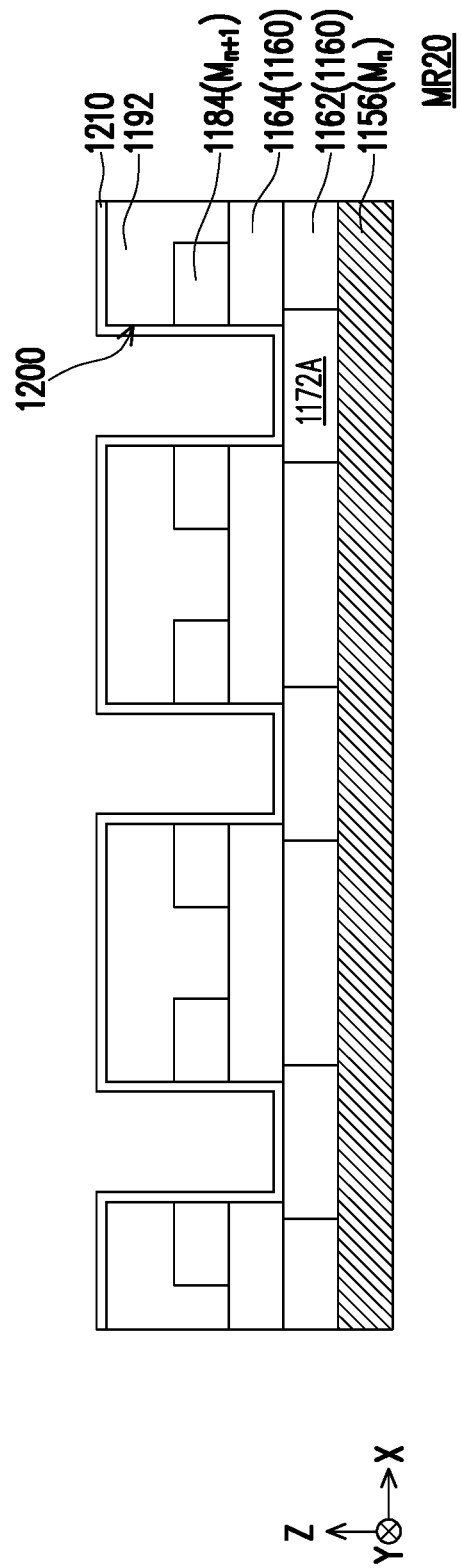
Figure 26:
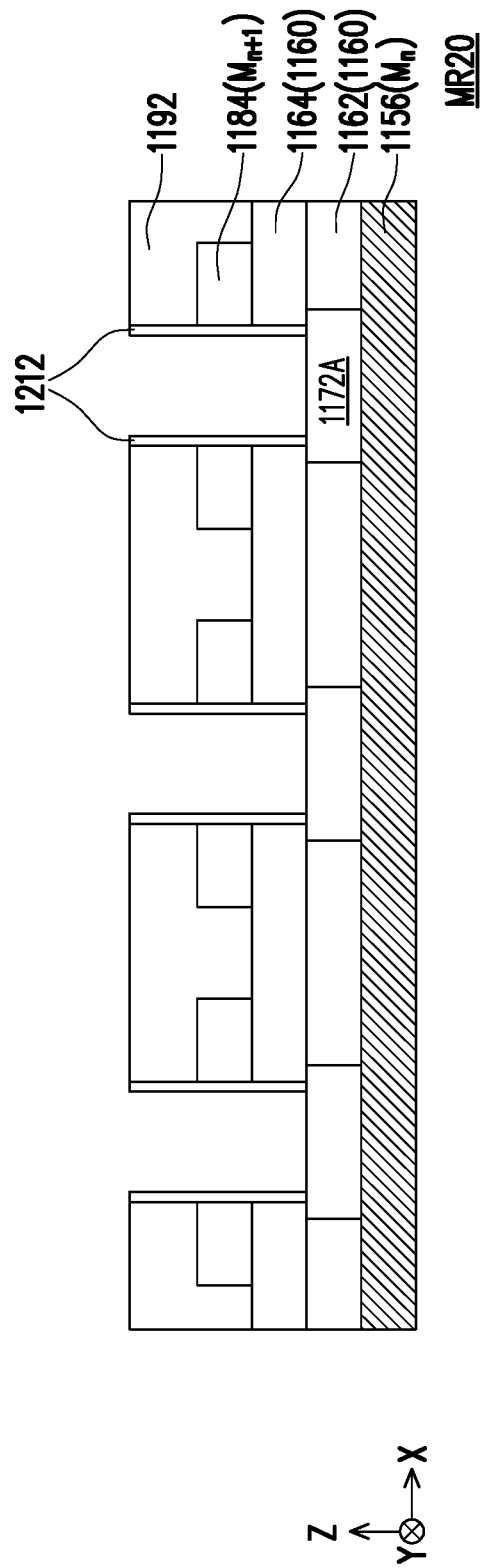

A high-k dielectric material 1210 may then be blanketly formed over the memory region MR20, conformally covering the top surfaces of the interlayer dielectric 1192 and lining the sidewalls of the openings 1200 to extend on the first metallic blocks 1172A at the bottom of the openings 1200, as illustrated in FIG. 25. In some embodiments, the high-k dielectric material 1210 contacts the interlayer dielectric 1164 and the gate patterns 1184 along the sidewalls of the openings 1200. Materials and processes to form the high-k dielectric material 1210 may be similar to the ones previously described. Referring to FIG. 25 and FIG. 26, portions of the high-k dielectric material 1210 may be removed from the bottom of the openings 1200 and from the top surface of the interlayer dielectric 1192, leaving high-k dielectric layers 1212 lining the sidewalls of the openings 1200. In some embodiments, the high-k dielectric material may be removed, for example via an etching process. The remaining high-k dielectric layers 1212 extend along the sidewalls of the openings 1200, on the interlayer dielectrics 1164 and 1192, and on the gate patterns 1184. In some embodiments, the first metallic blocks 1172A extend further in the XY plane than the openings 1200, so that the high-k dielectric layers 1212 may still be in contact with the first metallic blocks 1172A at the bottom of the openings 1212, as illustrated in FIG. 26.

Figure 27:
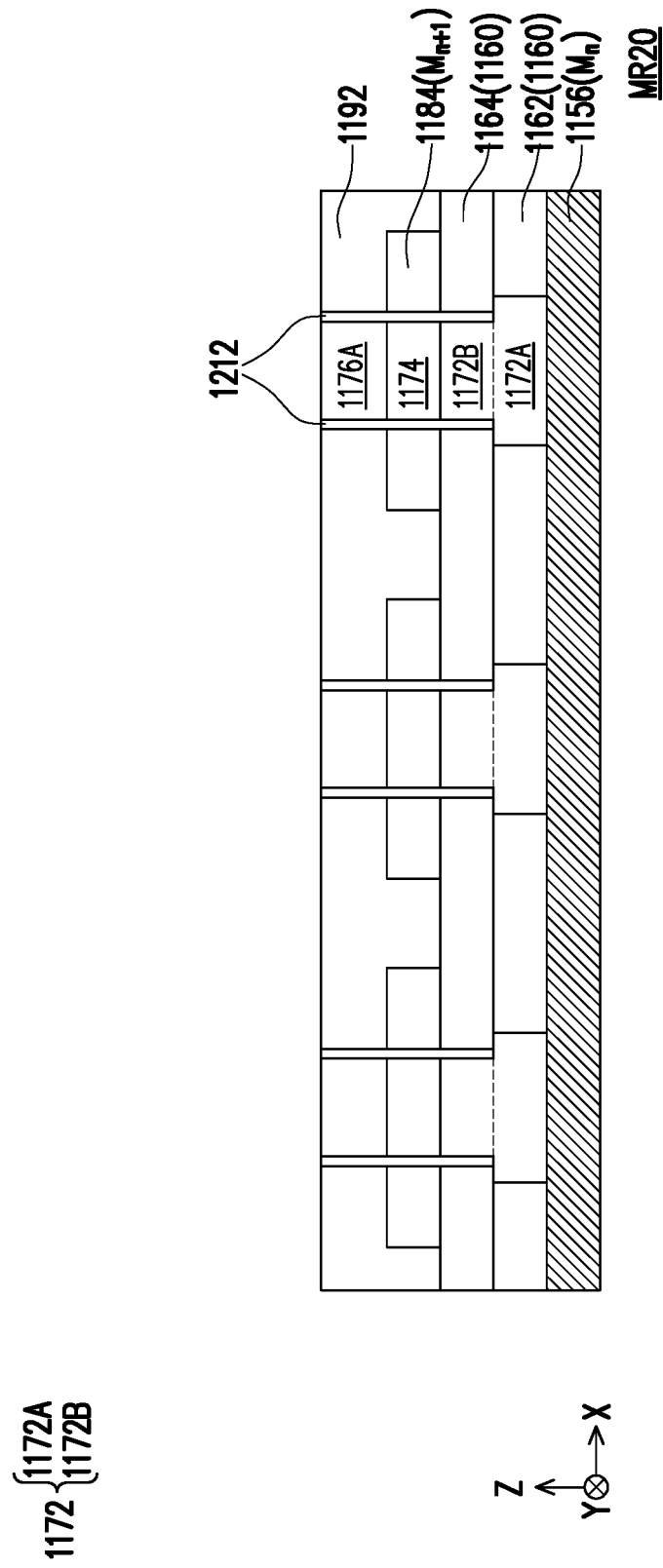

Referring to FIG. 27, a second metallic block 1172B, a semiconductor channel block 1174, and a third metallic block 1176A are formed, in order, on the first metallic block 1172A, in the spaces encircled by the high-k dielectric layers 1212, through a sequence of deposition steps. In some embodiments, the thickness of the second metallic block 1172B and the semiconductor channel block 1174 may be controlled by calibration of deposition and etching and inspection. In some embodiments, materials of the second metallic blocks 1172B and the third metallic blocks 1176A may be selected from the options described above for the bottom and top metallic layers 172, 176 (illustrated, e.g., in FIG. 3A). In some embodiments, the first metallic block 1172A and the second metallic block 1172B may include the same material. In some embodiments, the first metallic block 1172A and the second metallic block 1172B may be collectively referred to as a bottom metallic block 1172. In some embodiments, the bottom metallic block 1172 may reach the level height along the Z direction of the interface between the interlayer dielectric 1164 and the gate pattern 1184. In some embodiments, the semiconductor channel block 1174 is formed on the bottom metallic block 1172, in correspondence of the gate pattern 1184. That is, a projection of the semiconductor channel block 1174 along a direction lying in an XY plane may (sometimes entirely) fall on the gate pattern 1184. Alternatively stated, the semiconductor channel block 1174 may extend in the Z direction in between level heights passing through the gate pattern 1184. Materials and processes to form the semiconductor channel block 1174 may be similar to the ones previously described with reference to the semiconductor channel layer 174 (illustrated, e.g., in FIG. 3A). The third metallic block 1176A is then formed on the semiconductor channel block 1174, to fill the remaining spaces encircled by the high-k dielectric layers 1212.

Figure 28:
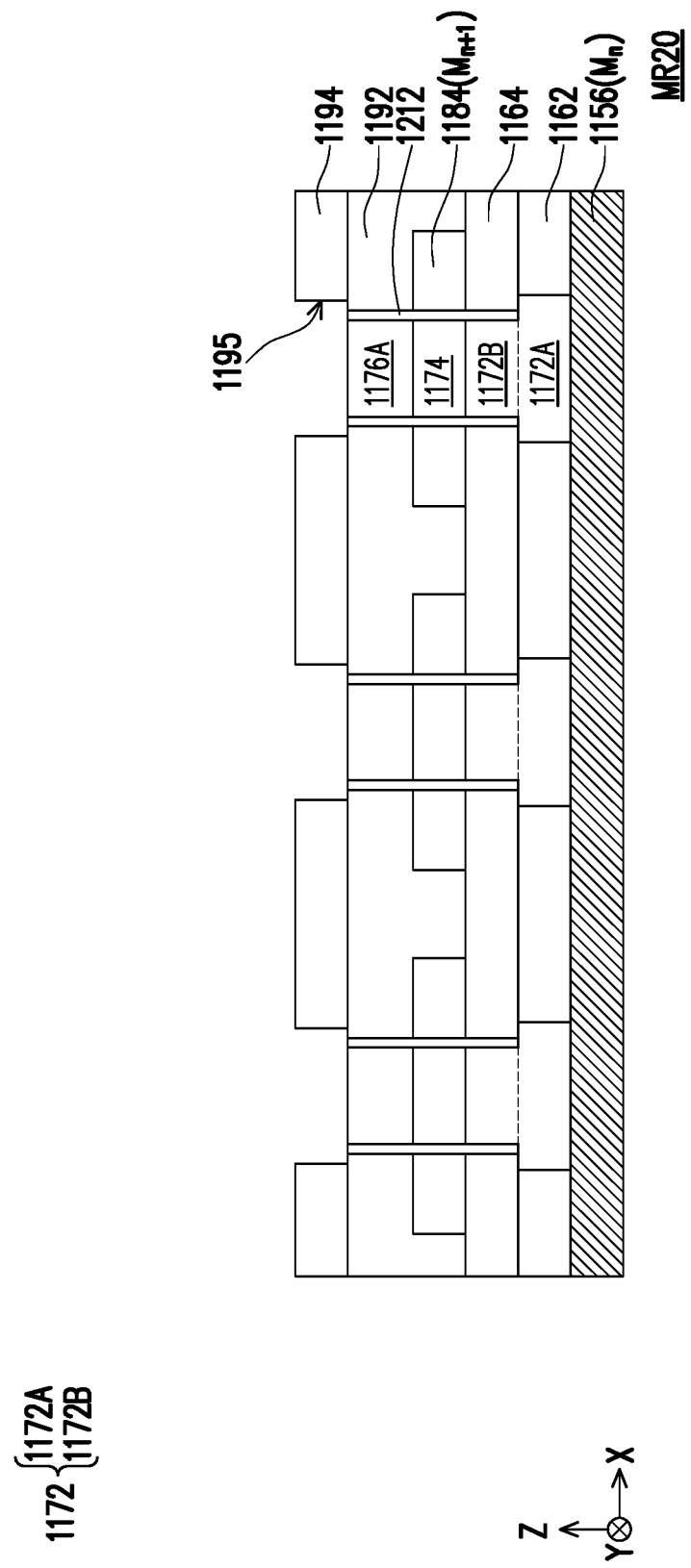
Figure 29:
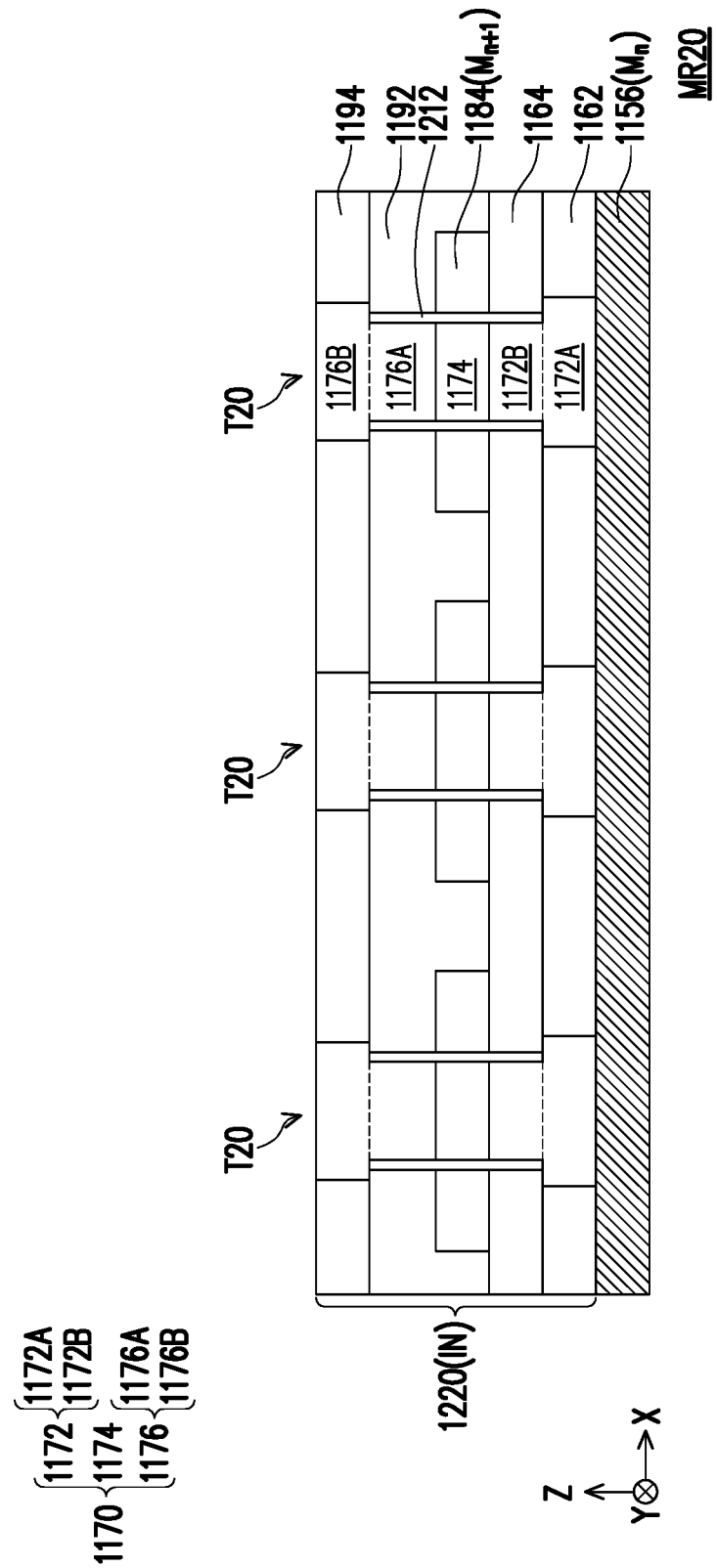

Referring to FIG. 28, in some embodiments an interlayer dielectric 1194 is formed on the interlayer dielectric 1192. The interlayer dielectric 1194 may be patterned to include openings 1195 exposing the third metallic block 1176A at their bottom. In some embodiments, the high-k dielectric layers 1212 may also be exposed at the bottom of the openings 1195. In some embodiments, there are as many openings 1195 as there are third metallic blocks 1176A, and each opening 1195 exposes a different third metallic block 1176A. Referring to FIG. 28 and FIG. 29, fourth metallic blocks 1176B are formed in the openings 1195 of the interlayer dielectric 1194. In some embodiments, the fourth metallic blocks 1176B are formed by depositing a conductive material (not shown) which may initially cover the interlayer dielectric 1194, followed by a planarization process during which portions of the conductive material is removed to expose again the interlayer dielectric 1194. In some embodiments, the fourth metallic blocks 1176B extend on the third metallic blocks 1176A and also on the high-k dielectric layers 1212 and portions of the interlayer dielectric 1192 surrounding the high-k dielectric layers 1212. That is, an upper end of a high-k dielectric layer 1212 may contact a fourth metallic block 1176B, and a lower end may contact a first metallic block 1172A underlying the fourth metallic block 1176B. In some embodiments, the third metallic blocks 1176A and the fourth metallic blocks 1176B may include the same material. In some embodiments, a third metallic block 1176A with the overlying fourth metallic block 1176B may be collectively referred to as a top metallic block 1176. In some embodiments, the bottom metallic block 1172, the semiconductor channel block 1174, and the top metallic block 1176 may be collectively referred to as a cell pillar 1170. In some embodiments, a cell pillar 1170 together with the surrounding high-k dielectric layer 1212 and gate pattern 1184 may form a transistor T20. In some embodiments, the transistors T20 are vertical gate-all-around transistors. The tier 1220 of the interconnection region IN in which the transistors T20 are formed may be referred to as an active device tier.

Figure 32A:
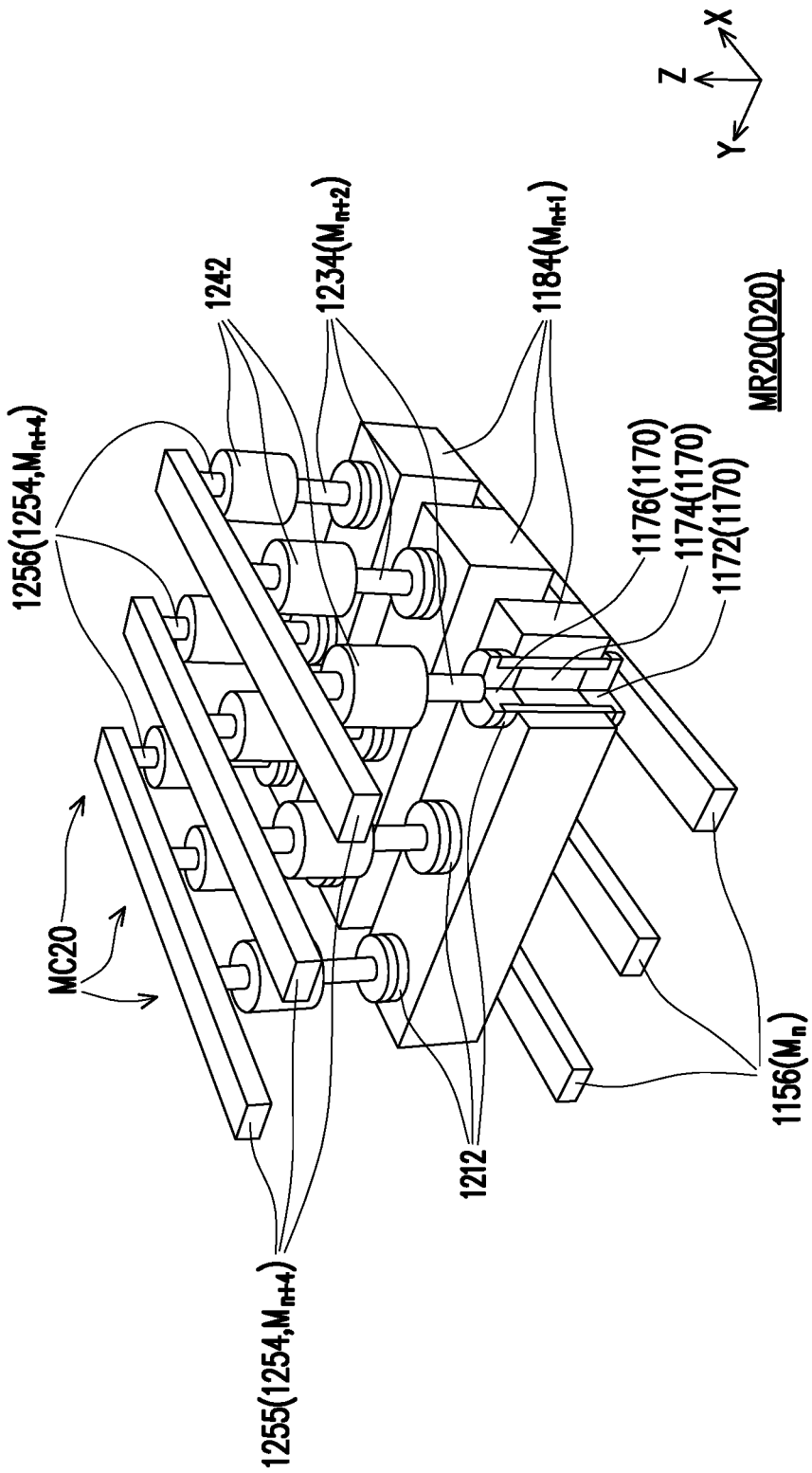
FIG. 32A is a schematic perspective view of a memory region of the semiconductor device of FIG. 31 according to some embodiments of the disclosure.
Figure 32B:
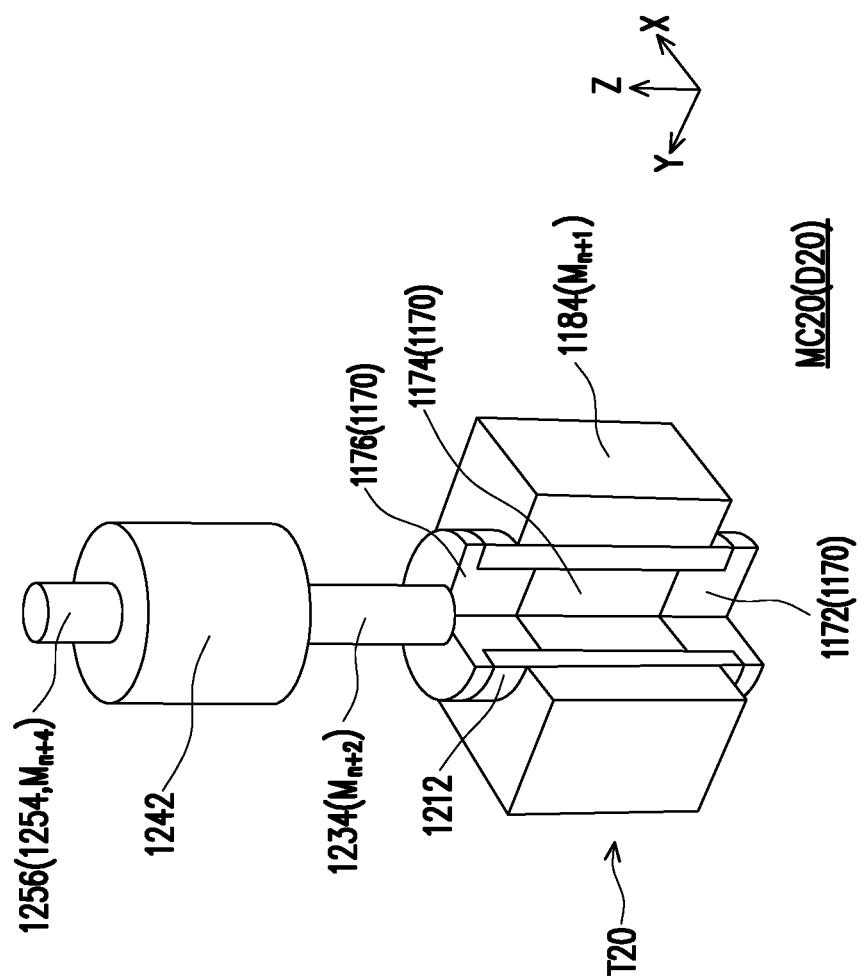
FIG. 32B is a schematic perspective view of a memory cell of the semiconductor device of FIG. 31 according to some embodiments of the disclosure.

FIG. 30 is a schematic cross-sectional view of a portion of the memory region MR20 of the semiconductor device D20 according to some embodiments of the disclosure. FIG. 31 is a schematic cross-sectional view of the semiconductor device D20 according to some embodiments of the disclosure. FIG. 32A is a schematic perspective view of a portion of the memory region MR20 according to some embodiments of the disclosure. FIG. 32B is a schematic perspective view of a memory cell MC20 according to some embodiments of the disclosure. In some embodiments, the semiconductor device D20 illustrated in FIG. 30 and FIG. 31 may be manufactured from the structure illustrated in FIG. 29 following process steps similar to the ones previously described with reference from FIG. 12A to FIG. 15. Briefly, one or more connection tiers 1230 are formed on the active device tier 1220. The connection tier 1230 includes an interlayer dielectric 1232 and conductive patterns 1234, which may include conductive plates 1235 connected to the top metallic blocks 1176 by conductive vias 1236. In some embodiments, there are as many conductive plates 1235 as there are cell pillars 1170, with each cell pillar 1170 being connected to a dedicated conductive plate 1235. A magnetic junction tier 1240 is then formed on the connection tier(s) 1230. The magnetic junction tier 1240 includes magnetic tunnel junctions 1242 disposed on the conductive plates 1235, one magnetic tunnel junction 1242 per conductive plate 1235. In some embodiments, the magnetic junction tier 1240 further includes an interlayer dielectric 1244 in which the magnetic tunnel junctions 1242 are embedded. In some embodiments, the magnetic junction tier 1240 further includes conductive patterns 1246 outside of the memory region MR20 which may be connected to other conductive patterns (e.g., the conductive patterns 1184) to perform different logic functions. Upper interconnection tiers are formed on the magnetic junction tier 1240, one of which (e.g., the tier 1250) includes conductive strips 1255 extending in a perpendicular direction with respect to the gate patterns 1184, and connected to the magnetic tunnel junctions 1242 by conductive vias 1256.

The semiconductor device D20 may have a similar structure to the semiconductor device D10 of FIG. 15, including a substrate region SB and an interconnection region IN formed on the substrate region. In the substrate region SB, active and passive devices (e.g., the transistors 1110, 1120) are formed in and/or on the semiconductor substrate 1100, and are integrated in a larger circuit by the conductive patterns (e.g., the conductive patterns 1134, 1144, 1154 and so on) of the interconnection region IN. The semiconductor device D20 includes the memory region MR20 formed in the interconnection region IN. An array of memory cells MC20 is formed within the memory region MR20. Each memory cell MC20 includes a transistor T20 and an associated magnetic tunnel junction 1242, for which the transistor T20 is configured to act as selector. In some embodiments, the memory cells MC20 may be part of an MRAM, with the gate patterns 1212 configured as word lines and the conductive strips 1255 configured as the bit lines. Both the transistors T20 and the magnetic tunnel junctions 1242 are formed on top of the metallization levels $M_n$ of the interconnection region IN. Therefore, the distance between the transistor T20 (selector) and the magnetic tunnel junction 1242 may be shortened, increasing the response speed of the memory cells MC20. As illustrated in FIG. 31, the gate patterns 1184 may be formed at the metallization level $M_{n+1}$, the magnetic tunnel junctions 1242 at the metallization level $M_{n+3}$, and the conductive patterns 1254 at the metallization level $M_{n+4}$.

Figure 33:
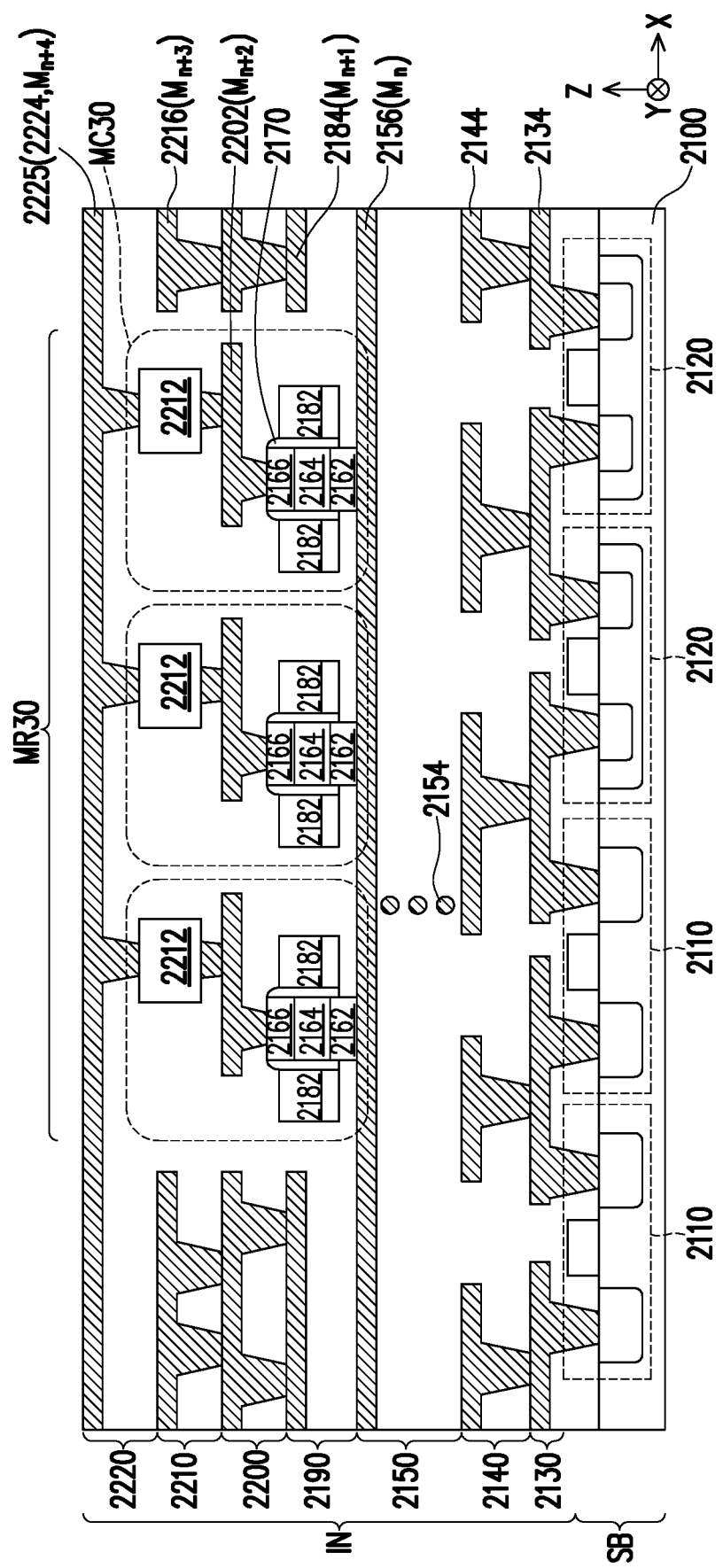
FIG. 33 is a schematic cross-sectional view of a semiconductor device according to some embodiments of the disclosure.
Figure 34:
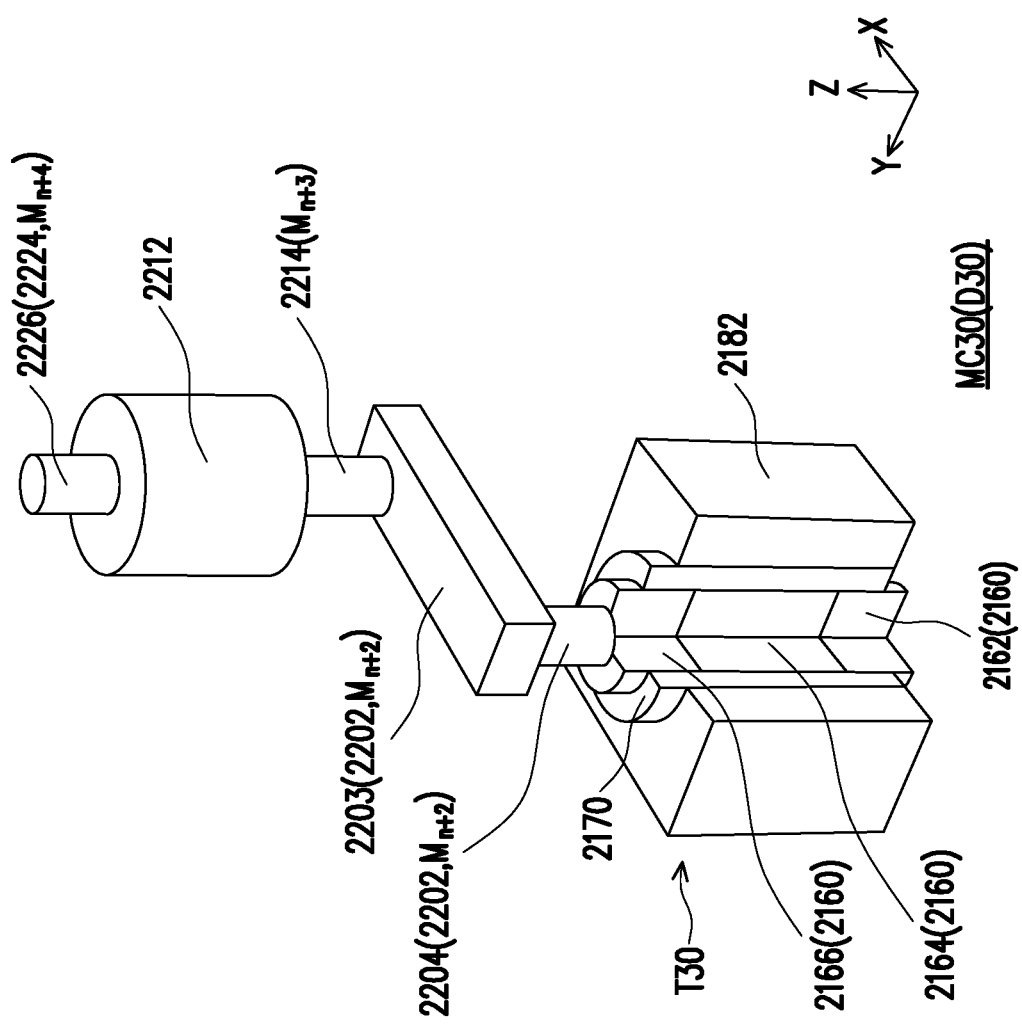
FIG. 34 is a schematic perspective view of a memory cell of the semiconductor device of FIG. 33 according to some embodiments of the disclosure.

FIG. 33 is a schematic cross-sectional view of a semiconductor device D30 according to some embodiments of the disclosure. FIG. 34 is a schematic cross-sectional view of a memory cell MC30 of the semiconductor device D30. The semiconductor device D30 may have a similar structure to the semiconductor device D10 of FIG. 15 or D20 of FIG. 31, and may be fabricated following similar manufacturing processes. Briefly, the semiconductor device D30 may include a substrate region SB and an interconnection region IN formed on the substrate region. In the substrate region SB, active and passive devices (e.g., the transistors 2110, 2120) are formed in and/or on the semiconductor substrate 2100, and are integrated in a larger circuit by the conductive patterns (e.g., the conductive patterns 2134, 2144, 2154 and so on) of the interconnection region IN. The semiconductor device D30 includes the memory region MR30 formed in the interconnection region IN. An array of memory cells MC30 is formed within the memory region MR30. Each memory cell MC30 includes a transistor T30 and an associated magnetic tunnel junction 2212, with the transistor T30 configured to act as selector for the associated magnetic tunnel junction 2212. The transistor T30 may include a cell pillar 2160, a high-k dielectric layer 2170 wrapped around the cell pillar 2160, and a gate pattern 2182 encircling the high-k dielectric layer 2170 and the cell pillar 2160. The cell pillar 2160 may include a bottom metallic block 2162, a semiconductor channel block 2164, and a top metallic block 2166, stacked, in order, on a conductive pattern 2156 of the metallization level $M_n$, where n can be in the range from 4 to 15. The transistor T30 may be formed in an active device tier 2190 of the interconnection region IN, with the gate patterns 2182 being part of the metallization level $M_{n+1}$. Conductive patterns 2184 performing different logic may be formed within the same metallization level $M_{n+1}$ outside the memory region MR30. The cell pillar 2160 may be connected to the magnetic tunnel junction 2212 formed in the magnetic junction tier 2210 by conductive patterns 2202, which may be part of a connection tier 2200 at a metallization level $M_{n+2}$. In some embodiments, additional conductive patterns 2216 may be formed in the magnetic junction tier 2210 outside of the memory region MR30. In some embodiments, each magnetic tunnel junction 2212 is associated with a dedicated transistor T30 to which is connected by a conductive pattern 2202. In some embodiments, the magnetic tunnel junctions 2212 are vertically misaligned with respect to the associated transistors T30. That is, the relative positions of a magnetic tunnel junction 2212 and the associated transistor T30 may be displaced along one or both of the X direction and the Y direction. For example, the conductive pattern 2202 may include a conductive plate 2203 having an elongated shape. A conductive via 2204 may be located at one end of the conductive plate 2203 and connect the conductive plate 2203 to the cell pillar 2160. The magnetic tunnel junction 2212 may be located at the other end of the conductive plate 2203, either directly on it, or through an intervening conductive via 2214, which may be part of the metallization level $M_{n+3}$ together with the magnetic tunnel junction 2212. In some embodiments, the memory cells MC30 may be part of an MRAM, with the gate patterns 2182 configured as word lines and the conductive strips 2225 of the conductive patterns 2224 of a higher interconnection tier 2220 configured as the bit lines. Both the transistors T30 and the magnetic tunnel junctions 2212 are formed on top of the metallization level $M_n$ of the interconnection region IN.

Figure 35:
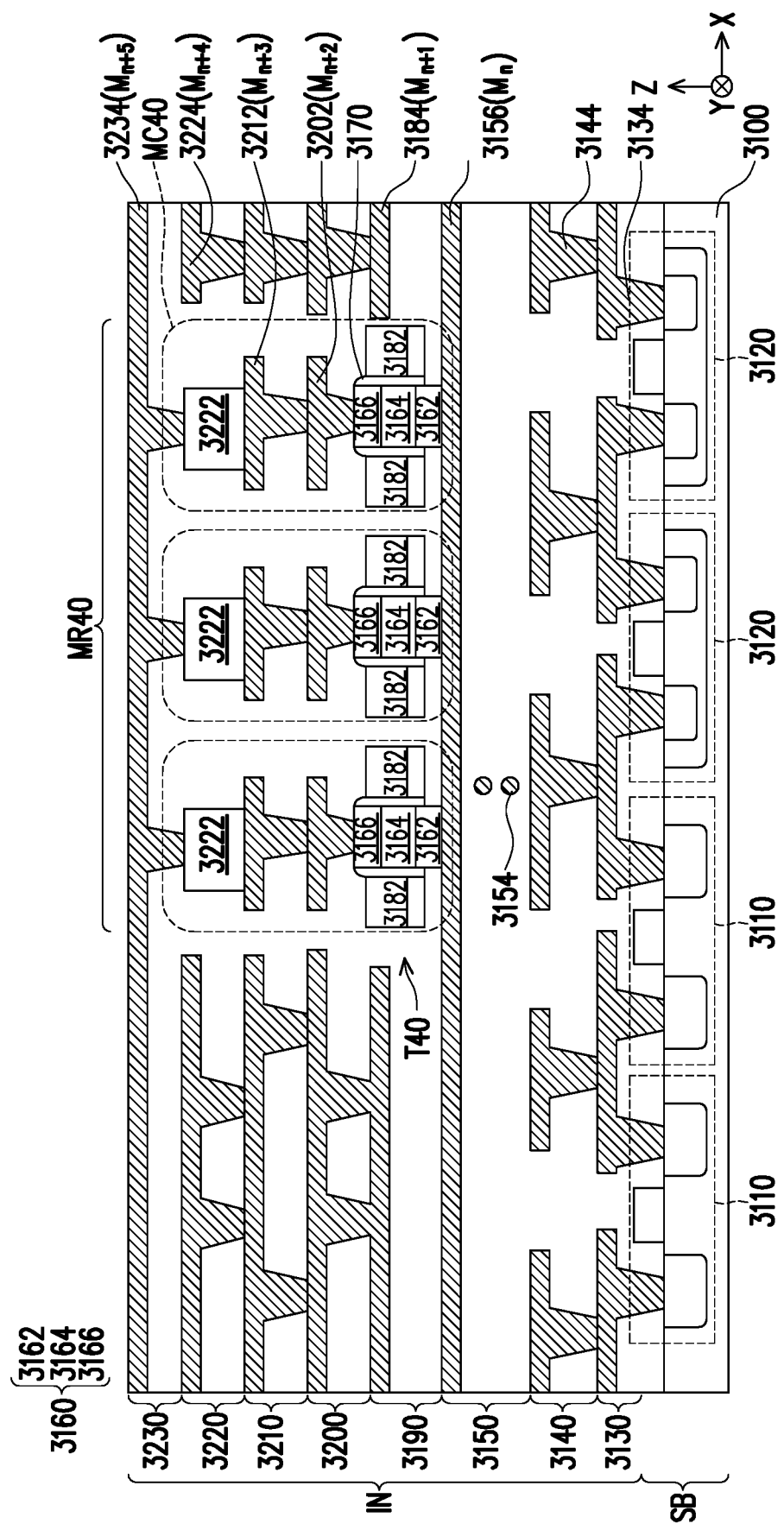
FIG. 35 is a schematic cross-sectional view of a semiconductor device according to some embodiments of the disclosure.

FIG. 35 is a schematic cross-sectional view of a semiconductor device D40 according to some embodiments of the disclosure. The semiconductor device D40 may have a similar structure to the semiconductor device D10 of FIG. 15, D20 of FIG. 31, or D30 of FIG. 33, and may be fabricated following similar manufacturing processes. Briefly, the semiconductor device D40 includes a substrate region SB and an interconnection region IN formed on the substrate region. In the substrate region SB, active and passive devices (e.g., the transistors 3110, 3120) are formed in and/or on the semiconductor substrate 3100, and are integrated in a larger circuit by the conductive patterns (e.g., the conductive patterns 3134, 3144, 3154 and so on) of the lower interconnection tiers (e.g., the tiers 3130, 3140, 3150) of the interconnection region IN. The semiconductor device D40 includes the memory region MR40 formed in the interconnection region IN. An array of memory cells MC40 is formed within the memory region MR40. Each memory cell MC40 includes a transistor T40 and an associated magnetic tunnel junction 3222, with the transistor T40 acting as a selector for the magnetic tunnel junction 3222. The transistor T40 may include a cell pillar 3160, a high-k dielectric layer 3170 wrapped around the cell pillar 3160, and a gate pattern 3182 encircling the high-k dielectric layer 3170 and the cell pillar 3160. The cell pillar 3160 may include a bottom metallic block 3162, a semiconductor channel block 3164, and a top metallic block 3166, stacked, in order, on a conductive pattern 3156 of the metallization level $M_n$, where n can be in the range from 4 to 15. The transistor T40 may be formed in an active device tier 3190 of the interconnection region IN, with the gate patterns 3182 being part of the metallization level $M_{n+1}$. Conductive patterns 3184, 3224 performing different logic functions may be formed within the corresponding metallization levels $M_{n+1}$, $M_{n+4}$ outside the memory region MR40. The cell pillar 3160 may be connected to the magnetic tunnel junction 3222 formed in the magnetic junction tier 3220 by a plurality of connection tiers, for example by the two connection tiers 3200, 3210 illustrated in FIG. 35. In some embodiments, each connection tier 3200, 3210 includes conductive patterns 3202, 3212 which connect a magnetic tunnel junction 3222 with the associated transistor T40. For example, the connection tier 3200 may include as many conductive patterns 3202 as there are cell pillars 3160, and each conductive pattern 3202 may be dedicated to an individual cell pillar 3160. Similarly, the connection tier 3210 may include as many conductive patterns 3212 as there are cell pillars 3160, and each conductive pattern 3212 may connect the underlying conductive pattern 3202 to the overlying magnetic tunnel junction 3222. In some embodiments, the conductive patterns 3202 are formed at the metallization level $M_{n+2}$ and the conductive patterns 3212 are formed at the metallization level $M_{n+3}$, while the magnetic tunnel junctions 3222 are formed at the metallization level $M_{n+4}$. In some embodiments, the memory cells MC40 may be part of an MRAM, with the gate patterns 3182 configured as word lines and the conductive strips 3234 of the metallization level $M_{n+5}$ configured as the bit lines.

Figure 36:
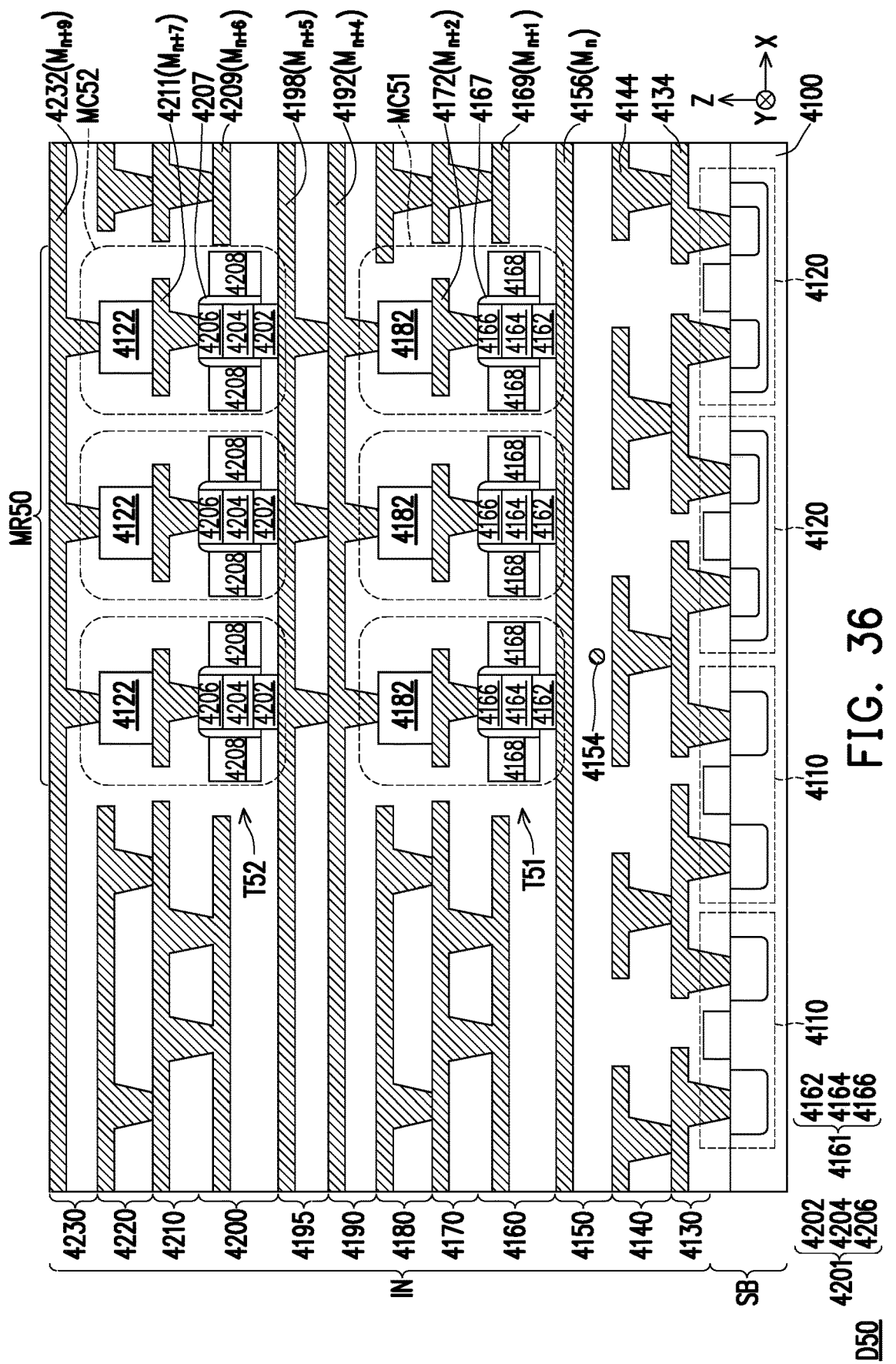
FIG. 36 is a schematic cross-sectional view of a semiconductor device according to some embodiments of the disclosure.

FIG. 36 is a schematic cross-sectional view of a semiconductor device D50 according to some embodiments of the disclosure. The semiconductor device D50 may have a similar structure to the semiconductor device D10 of FIG. 15, D20 of FIG. 31, D30 of FIG. 33, or D40 of FIG. 35, and may be fabricated following similar manufacturing processes. Briefly, the semiconductor device D50 includes a substrate region SB and an interconnection region IN formed on the substrate region SB. In the substrate region SB, active and passive devices (e.g., the transistors 4110, 4120) are formed in and/or on the semiconductor substrate 4100, and are integrated in a larger circuit by the conductive patterns (e.g., the conductive patterns 4134, 4144, 4154 and so on) of the lower interconnection tiers (e.g., the tiers 4130, 4140, 4150) of the interconnection region IN. The semiconductor device D50 includes the memory region MR50 formed in the interconnection region IN. In some embodiments, the semiconductor device D50 includes an array of memory cells MC51 formed within the memory region MR50. Each memory cell MC51 includes a transistor T51 and an associated magnetic tunnel junction 4182, with the transistor T51 acting as a selector for the magnetic tunnel junction 4182. The transistor T51 may include a cell pillar 4161, a high-k dielectric layer 4167 wrapped around the cell pillar 4161, and a gate pattern 4168 encircling the high-k dielectric layer 4167 and the cell pillar 4161. The cell pillar 4161 may include a bottom metallic block 4162, a semiconductor channel block 4164, and a top metallic block 4166, stacked, in order, on a conductive pattern 4156 of the metallization level $M_n$, where n can be in the range from 4 to 15. The transistors T51 may be formed in an active device tier 4160 of the interconnection region IN, with the gate patterns 4168 being part of the metallization level $M_{n+1}$. Conductive patterns 4169 performing different logic may be formed within the same metallization level $M_{n+1}$ outside the memory region MR50. The cell pillar 4161 may be connected to the magnetic tunnel junction 4182 by one or more connection tiers 4170. The connection tier 4170 includes conductive patterns 4172 which connect a magnetic tunnel junction 4182 with the associated transistor T51. The conductive strip 4192 of a higher interconnection tier 4190 may be configured as bit lines for the memory cells MC51.

In some embodiments, the semiconductor device D50 includes another array of memory cells MC52 stacked over the memory cells MC51. The memory cells MC52 may be configured in a similar manner as the memory cells MC51, with transistors T52 acting as selectors for the magnetic tunnel junctions 4122, to which they are connected by conductive patterns 4111. The transistors T52 includes cell pillars 4201, high-k dielectric layers 4207 and gate patterns 4208. The cell pillars 4201 include bottom metallic blocks 4202, semiconductor channel blocks 4204, and top metallic blocks 4206 stacked in order. In some embodiments, the gate patterns 4208 and the cell pillars 4201 are formed in an active device tier 4200 at a metallization level higher than the metallization level of the conductive strips 4192 acting as bit lines for the memory cells MC51. For example, the conductive strips 4192 (bit lines) of the memory cells MC51 may be located at the tier 4190 corresponding to the metallization level $M_{n+4}$, the cell pillars 4201 may be formed on conductive strips 4198 belonging to an upper tier 4195, for example at the metallization level $M_{n+5}$, the gate patterns 4208 may be part of a higher metallization level, e.g., $M_{n+6}$, the conductive patterns 4111 may be part of an even higher metallization level, e.g., $M_{n+7}$, and the magnetic tunnel junctions 4122 may be formed at a still higher metallization level, e.g., $M_{n+8}$. Conductive strips 4232 of a higher interconnection tier 4230 formed over the magnetic junction tier 4220, for example at the metallization level $M_{n+9}$, may be configured as bit lines for the memory cells MC52. That is, in some embodiments, by embedding the components of the memory cells MC51, MC52 in the interconnection region IN, vertical stacking (along the Z direction) of the memory cells MC51, MC52 may be possible, thus increasing the integration density of the semiconductor device D50 with little if any area penalty.

Figure 37B:
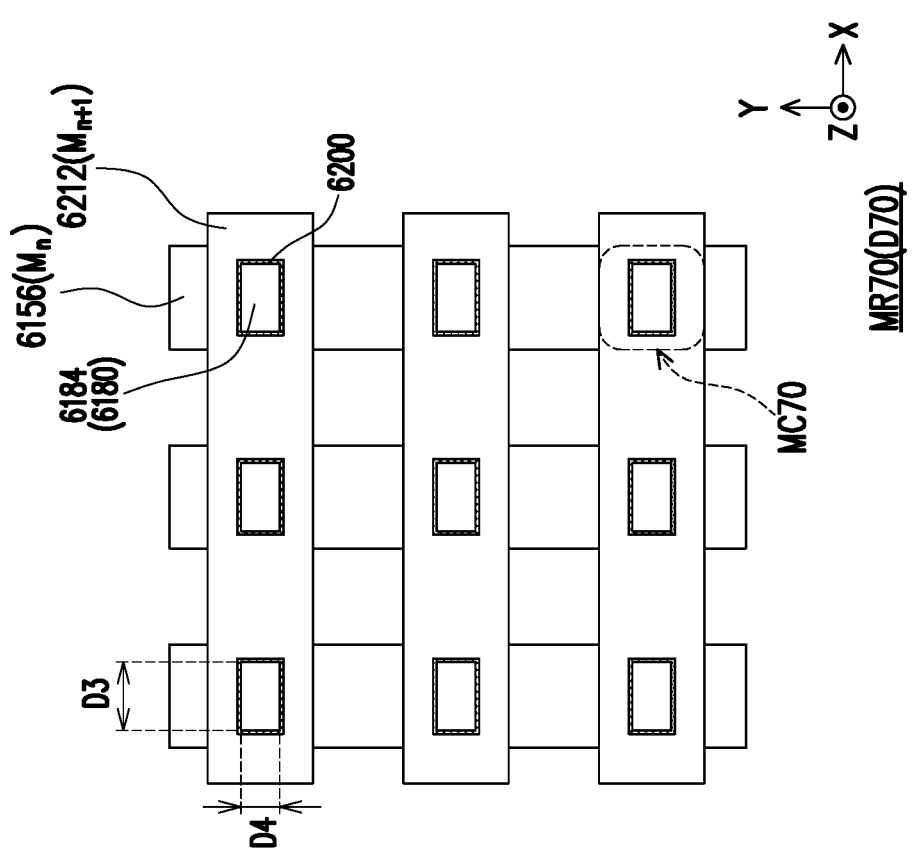
FIG. 37A to FIG. 37E are schematic cross-sectional views of memory regions of semiconductor devices according to some embodiments of the disclosure.
Figure 37A:
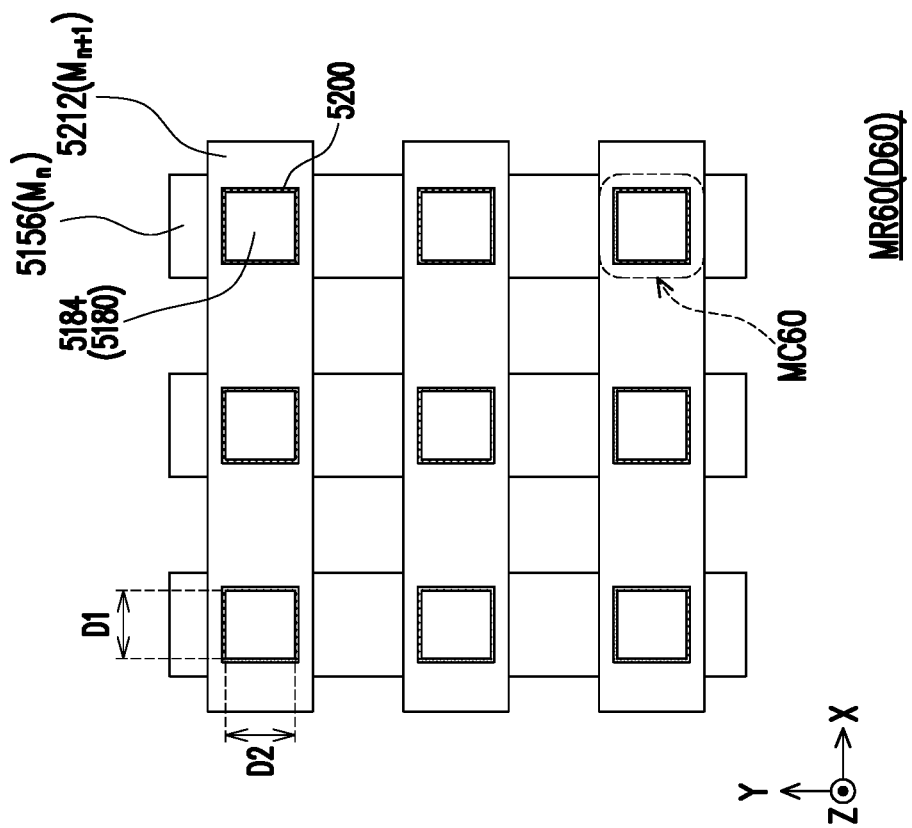
Figure 37D:
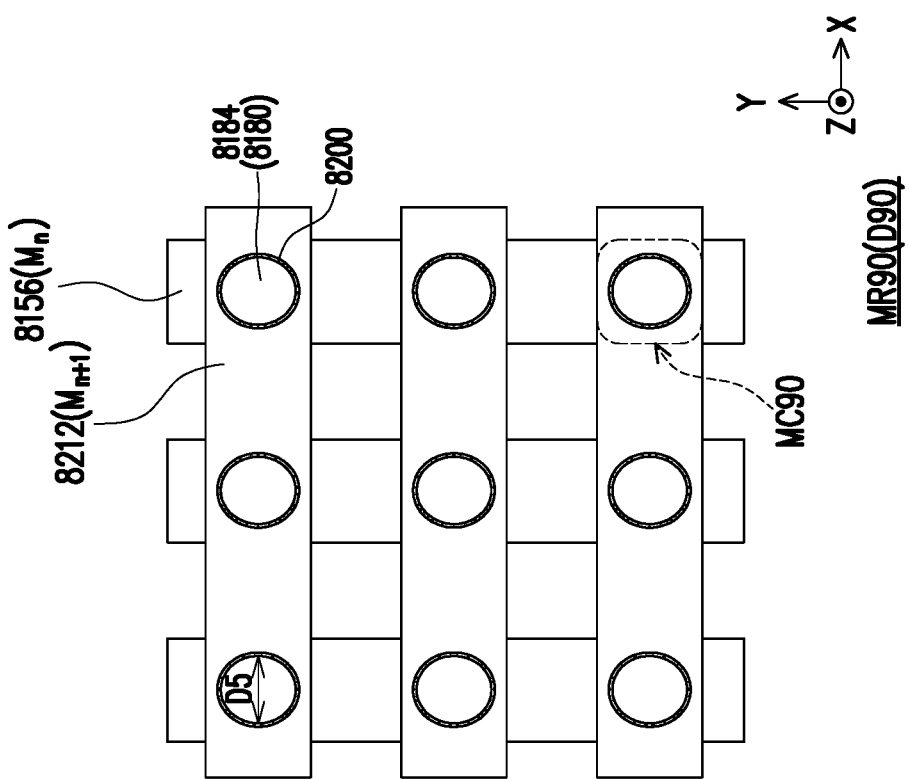
Figure 37C:
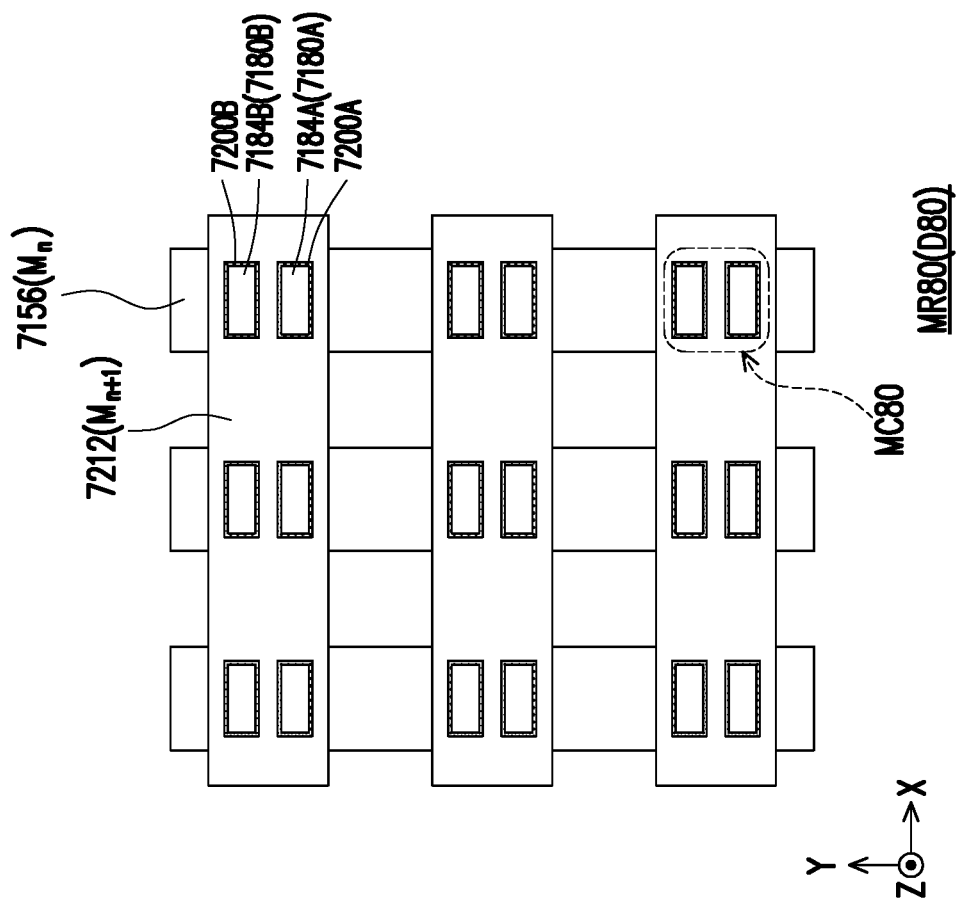
Figure 37E:
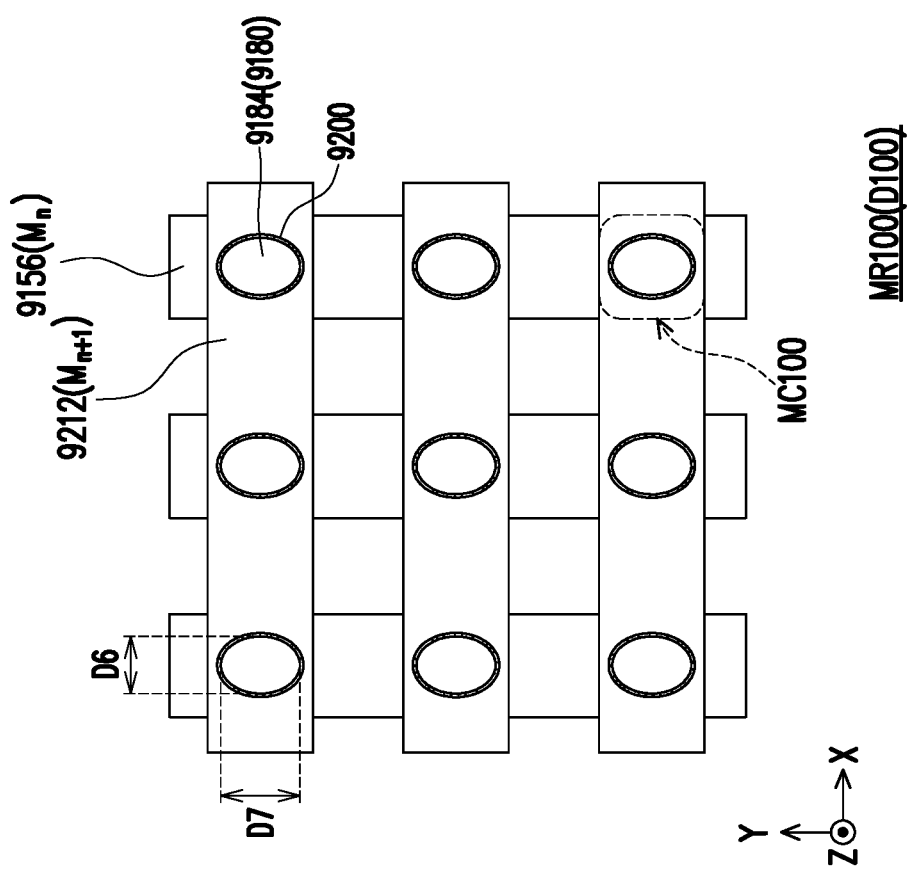

FIG. 37A is a schematic cross-sectional view of a portion of the memory region MR60 of a semiconductor device D60 according to some embodiments of the disclosure. The cross-sectional view of FIG. 37A is taken at a level height along the Z direction passing through the semiconductor channel blocks 5184 and the gate patterns 5212. The semiconductor device D60 may be similar to any one of the semiconductor devices D10, D20, D30, D40, or D50 described above, and may be manufactured following similar processes. For clarity of illustration, in the view of FIG. 37A are illustrated only the conductive patterns 5156 on which the cell pillars 5180 are formed, the semiconductor channel blocks 5184 of the cell pillars 5180, the high-k dielectric layers 5200, and the gate patterns 5212, however, the memory cells MC60 include other components as previously described, such as the magnetic tunnel junctions. In some embodiments, the semiconductor channel blocks 5184 of the memory cells MC60 were formed so as to have a substantially square footprint, with dimensions D1 and D2 along two perpendicular directions (e.g., the X and Y directions) substantially equal. However, the disclosure is not limited thereto. In some embodiments, the ratio of the dimension D1 to the dimension D2 may be in the range from 1 to 7, resulting in channels of elongated shape in an XY plane perpendicular with respect to the direction of the current flow (Z direction). For example, as illustrated in FIG. 37B for the memory region MR70 of the semiconductor device D70, the cell pillars 6180 may have a dimension D3 along a first direction (e.g., the X direction along which the gate patterns 6212 extend) larger than a second dimension D4 along a second direction perpendicular to the first direction (e.g., the Y direction). That is, the cell pillars 6180 may be formed as slabs or fins on the conductive patterns 6156. In some alternative embodiments, the longer sides may be oriented along the extending direction of the conductive patterns 6156, resulting in the dimension D4 being larger than the dimension D3. In some embodiments, multiple slabs or fins (e.g., two or more) may be included in a same memory cell. For example, in the memory region MR80 of the semiconductor device D80 illustrated in FIG. 37C, the memory cells MC80 include two cell pillars 7180A, 7180B. The cell pillars 7180A, 7180B may have an elongated profile along the X or Y direction, and may be disposed parallel to each other along the direction of the shorter side. For example, as illustrated in FIG. 37C, the cell pillars 7180A, 7180B are elongated along the X direction, and are distributed within the memory cells MC80 along the Y direction. For example, the aspect ratio of the longer side (D3) to the shorter side (D4) may be about 7. In some embodiments, a gap separating the slabs or fins of a same memory cell MC80 may be about the same size as the shorter sides of the slabs or fins. In some embodiments, by disposing multiple fins or slabs within a memory cell MC80, the increase in the contact area between the semiconductor channel blocks 7184A, 7184B and the gate pattern 7212 results in an increase in driving current of the magnetic tunnel junction with little if any area penalty. In FIG. 37A to FIG. 37C, the semiconductor channel blocks 5184, 6184, 7184A, 7184B were shown as having square or rectangular footprints, with the edges meeting at substantially right angles. However, the disclosure is not limited thereto. For example, as illustrated for the memory region MR90 of the semiconductor device D90 in FIG. 37D, the memory cells MC90 may include semiconductor channel blocks 8184 having a rounded or even circular footprint, with a diameter D5 substantially constant within the XY plane. That is, the cell pillars 8180 may be substantially round columns extending through the gate patterns 8212. In some alternative embodiments, as illustrated in FIG. 37E for the memory region MR100 of the semiconductor device D100, the semiconductor channel blocks 9184 may have an elliptical footprint, with a major axis D7 and a minor axis D7 extending along the Y and X directions, respectively. That is, in the memory cells MC100, the footprint of the semiconductor channel blocks 9184 may be elongated in the extending direction of the conductive patterns 9156 (e.g., the Y direction). However, the disclosure is not limited thereto, and, in some alternative embodiments, the elongation direction of the footprint may be along the extending direction of the gate patterns 9212 (e.g., the X direction). In some yet alternative embodiments, the footprint of the cell pillars may have still other shapes, for example triangular, pentagonal, hexagonal, or other polygonal shapes. As illustrated in FIG. 37A-37E, the high-k dielectric layers 5200, 6200, 7200A, 7200B, 8200, 9200 conformally wrap around the respective semiconductor channel blocks 5184, 6184, 7184A, 7184B, 8184, 9184. As previously discussed, the footprint of the semiconductor channel blocks 5184, 6184, 7184A, 7184B, 8184, 9184 may be determined either by transferring the pattern of a protective mask to blanketly formed semiconductor layers (as illustrated, e.g., in FIG. 4A to FIG. 5B), or by depositing the semiconductor material in openings extending through previously formed gate patters (as illustrated, e.g., from FIG. 23 to FIG. 27).

In accordance with some embodiments of the disclosure, a semiconductor device includes a semiconductor substrate and an interconnection region disposed on the semiconductor substrate. The interconnection region includes stacked metallization levels, a magnetic tunnel junction, and a transistor. The magnetic tunnel junction is formed on a first conductive pattern of a first metallization level of the stacked metallization levels. The transistor is formed on a second conductive pattern of a second metallization level of the stacked metallization levels. The transistor is a vertical gate-all-around transistor. A drain contact of the transistor is electrically connected to the magnetic tunnel junction by the first conductive pattern of the first metallization level. The second metallization level is closer to the semiconductor substrate than the first metallization level.

In accordance with some embodiments of the disclosure, a semiconductor device includes a semiconductor substrate, lower interconnection tiers, an active device tier, and a magnetic junction tier. The lower interconnection tiers are disposed on the semiconductor substrate. The lower interconnection tiers include a first conductive pattern extending in a first direction on an interlayer dielectric. The active device tier is disposed on the lower interconnection tiers.

The active device tier includes a cell pillar and a gate pattern. The cell pillar is formed on the first conductive pattern. The cell pillar includes a semiconductor channel block disposed in between a pair of metallic blocks. The gate pattern extends in a second direction perpendicular to the first direction. The gate pattern laterally wraps the cell pillar around the semiconductor channel block. The magnetic junction tier is disposed over the active device tier and includes a magnetic tunnel junction adapted to receive electric current flowing through the cell pillar. The semiconductor channel block includes a semiconductor oxide material.

In accordance with some embodiments of the disclosure, a manufacturing method of a semiconductor device includes the following steps. Conductive patterns of lower interconnection tiers are formed on a semiconductor substrate. The lower interconnection tiers are stacked over each other on the semiconductor substrate. A first metallic material is deposited on a first conductive pattern of the conductive patterns of the lower interconnection tiers to form a first metallic block. The first conductive pattern extends in a first direction. A semiconductor oxide is deposited on the first metallic block to form a semiconductor channel block. A second metallic material is deposited on the semiconductor channel block to form a second metallic block. A third metallic material is deposited over the lower interconnection tiers to form a gate pattern extending in a second direction perpendicular to the first direction. The gate pattern encircles the semiconductor channel block. A conductive plate is formed. The conductive plate is connected on one side to the second metallic block. A magnetic tunnel junction is formed. The magnetic tunnel junction is connected to an opposite side of the conductive plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate and
   an interconnection region disposed on the semiconductor substrate, the interconnection region comprising:
   stacked metallization levels;
   a magnetic tunnel junction formed on a first conductive pattern of a first metallization level of the stacked metallization levels; and
   a transistor formed on a second conductive pattern of a second metallization level of the stacked metallization levels,
   wherein the transistor is a vertical gate-all-around transistor,
   a drain contact of the transistor is electrically connected to the magnetic tunnel junction by the first conductive pattern of the first metallization level, and
   the second metallization level is closer to the semiconductor substrate than the first metallization level.

2. The semiconductor device of claim 1, wherein the drain contact of the transistor includes a metallic block disposed over the second conductive pattern.

3. The semiconductor device of claim 1, wherein the transistor comprises a gate pattern formed at a third metallization level of the stacked metallization levels, wherein the third metallization level is closer to the semiconductor substrate than the first metallization level, and the second metallization level is closer to the semiconductor substrate than the third metallization level.

4. The semiconductor device of claim 3, wherein the transistor further comprises a semiconductor channel block disposed between the drain contact and the second conductive pattern, and the gate pattern laterally encircles the semiconductor channel block.

5. The semiconductor device of claim 4, wherein the transistor further comprises a source contact disposed between the semiconductor channel block and the second conductive pattern, wherein the source contact, the semiconductor channel block, and the drain contact are stacked, in order, on the second conductive pattern.

6. The semiconductor device of claim 1, wherein the first conductive pattern includes a conductive plate, and the magnetic tunnel junction is disposed on the conductive plate.

7. The semiconductor device of claim 1, wherein the drain contact is in direct contact with a third conductive pattern of a third metallization level of the stacked metallization levels, the third conductive pattern connects the drain contact to the first conductive pattern, and the third metallization level is closer to the semiconductor substrate than the first metallization level.

8. A semiconductor device, comprising:
   a semiconductor substrate;
   lower interconnection tiers disposed on the semiconductor substrate, the lower interconnection tiers comprising a first conductive pattern extending in a first direction on an interlayer dielectric;
   an active device tier disposed on the lower interconnection tiers, the active device tier comprising:
   a cell pillar, disposed on the first conductive pattern, the cell pillar comprising a semiconductor channel block disposed in between a pair of metallic blocks, and
   a gate pattern, extending in a second direction perpendicular to the first direction, laterally wrapping the cell pillar around the semiconductor channel block; and
   a magnetic junction tier, disposed over the active device tier and comprising a magnetic tunnel junction adapted to receive electric current flowing through the cell pillar,
   wherein the semiconductor channel block includes a semiconductor oxide material.

9. The semiconductor device of claim 8, wherein the active device tier further comprises a high-k dielectric layer wrapped around the cell pillar and separating the cell pillar from the gate pattern.

10. The semiconductor device of claim 9, wherein the high-k dielectric layer extends on a bottom metallic block of the pair of metallic blocks, and a top metallic block of the pair of metallic blocks extends on the high-k dielectric layer.

11. The semiconductor device of claim 8, wherein the cell pillar is one of a plurality of cell pillars formed in the active device tier and disposed aligned along the second direction, and the gate pattern laterally wraps the plurality of cell pillars.

12. The semiconductor device of claim 8, wherein the magnetic tunnel junction is one of a plurality of magnetic tunnel junctions formed in the magnetic junction tier and disposed in rows extending along the first direction, and the semiconductor device further comprises an upper interconnection tier comprising second conductive patterns extending along the first direction, wherein each second conductive pattern is electrically connected to a corresponding row of magnetic tunnel junctions.

13. The semiconductor device of claim 8, wherein a first interconnection via connects the cell pillar to one end of a conductive plate, and a second interconnection via connects the magnetic tunnel junction to another end of the conductive plate.

14. The semiconductor device of claim 8, further comprising:
  another active device tier formed over the magnetic junction tier, wherein the other active device tier comprises:
    another cell pillar, the other cell pillar comprising another semiconductor channel block disposed in between another pair of metallic blocks, and
    another gate pattern, extending in the second direction and laterally wrapping the other cell pillar around the other semiconductor channel block, and
    another magnetic junction tier formed over the other active device tier, the other magnetic junction tier comprising another magnetic tunnel junction adapted to receive electric current flowing through the other cell pillar.

15. A method of forming semiconductor device, comprising:
  forming a semiconductor substrate; and
  forming an interconnection region disposed on the semiconductor substrate, the interconnection region comprising:
    stacked metallization levels;
    a magnetic tunnel junction formed on a first conductive pattern of a first metallization level of the stacked metallization levels; and
    a transistor formed on a second conductive pattern of a second metallization level of the stacked metallization levels,
    wherein the transistor is a vertical gate-all-around transistor,
    a drain contact of the transistor is electrically connected to the magnetic tunnel junction by the first conductive pattern of the first metallization level, and
    the second metallization level is closer to the semiconductor substrate than the first metallization level.

16. The method of claim 15, wherein the drain contact of the transistor includes a metallic block disposed over the second conductive pattern.

17. The method of claim 15, wherein the transistor comprises a gate pattern formed at a third metallization level of the stacked metallization levels, wherein the third metallization level is closer to the semiconductor substrate than the first metallization level, and the second metallization level is closer to the semiconductor substrate than the third metallization level.

18. The method of claim 17, wherein the transistor further comprises a semiconductor channel block disposed between the drain contact and the second conductive pattern, and the gate pattern laterally encircles the semiconductor channel block.

19. The method of claim 18, wherein the transistor further comprises a source contact disposed between the semiconductor channel block and the second conductive pattern, wherein the source contact, the semiconductor channel block, and the drain contact are stacked, in order, on the second conductive pattern.

20. The method of claim 15, wherein the first conductive pattern includes a conductive plate, and the magnetic tunnel junction is disposed on the conductive plate.

* * * * *